United States Patent
Hayasaka

(10) Patent No.: US 8,436,649 B2
(45) Date of Patent: May 7, 2013

(54) SEMICONDUCTOR DEVICE, INFORMATION PROCESSING APPARATUS, AND METHOD FOR CONFIGURING CIRCUITS OF SEMICONDUCTOR DEVICE

(75) Inventor: Kazumi Hayasaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 13/064,550

(22) Filed: Mar. 30, 2011

(65) Prior Publication Data

US 2011/0175645 A1 Jul. 21, 2011

Related U.S. Application Data

(63) Continuation of application No. PCT/JP2008/067844, filed on Oct. 1, 2008.

(51) Int. Cl.
*H03K 19/177* (2006.01)
(52) U.S. Cl.
USPC ............................. 326/41; 326/38; 326/47
(58) Field of Classification Search .............. 326/37–41, 326/47
See application file for complete search history.

(56) References Cited

U.S. PATENT DOCUMENTS

| 5,868,666 | A | 2/1999 | Okada et al. |
| 6,654,889 | B1* | 11/2003 | Trimberger .................. 713/191 |
| 2006/0119384 | A1 | 6/2006 | Camarota et al. |
| 2008/0024163 | A1* | 1/2008 | Marui ............................ 326/39 |

FOREIGN PATENT DOCUMENTS

| EP | 1 667 327 A2 | 6/2006 |
| JP | 07-154241 | 6/1995 |
| JP | 2001-186010 | 7/2001 |
| JP | 2005-115699 | 4/2005 |
| JP | 2006-166430 | 6/2006 |

OTHER PUBLICATIONS

International Search Report for PCT/JP2008/067844, Mailed Dec. 22, 2008.

* cited by examiner

*Primary Examiner* — Jany Richardson
(74) *Attorney, Agent, or Firm* — Staas & Halsey LLP

(57) ABSTRACT

Disclosed is a semiconductor device including a circuit information supply unit that supplies circuit information acquired from an outside of the semiconductor device; circuit configuration units that configure respective circuits based on the circuit information supplied from the circuit information supply unit; a specification unit that specifies whether to execute circuit configuration with respect to the circuit configuration unit; and a signal fixation unit that fixes values of signals outputted from the circuit configuration units to a designated value during a period at which the specified circuit configuration unit configures corresponding circuits based on the circuit information.

14 Claims, 25 Drawing Sheets

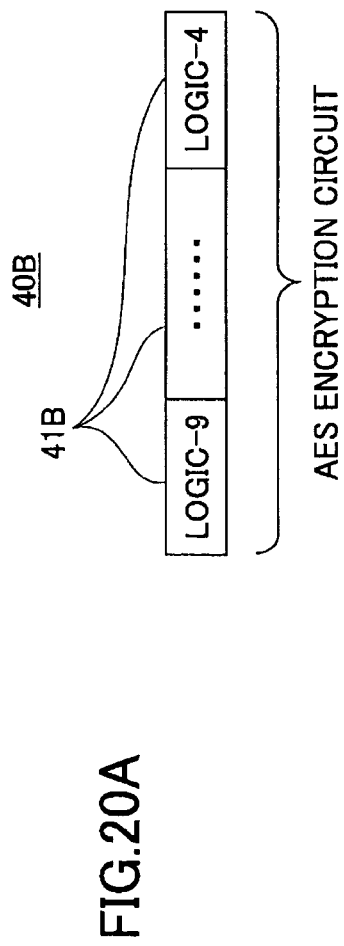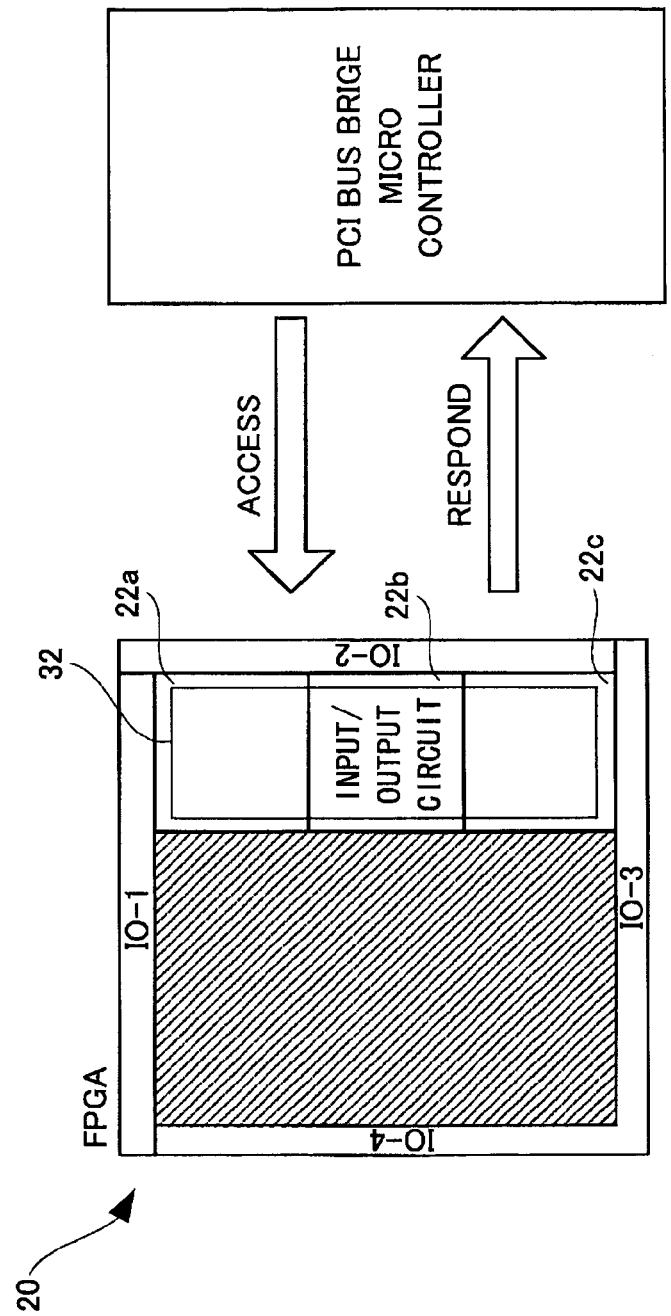
FIG.20A
FIG.20B

SEMICONDUCTOR DEVICE, INFORMATION PROCESSING APPARATUS, AND METHOD FOR CONFIGURING CIRCUITS OF SEMICONDUCTOR DEVICE

CROSS-REFERENCE TO RELATED APPLICATION

This application is a U.S. continuation application filed under 35 U.S.C. 111(a) claiming benefit under 35 U.S.C. 120 and 365(c) of PCT application JP2008/067844, filed on Oct. 1, 2008, the entire contents of which are incorporated herein by reference.

FIELD

The embodiment discussed herein is related to a semiconductor device, an information processing apparatus, and a method for configuring the circuits of the semiconductor device.

BACKGROUND

Up until now, there has been discussed providing a FPGA (Field Programmable Gate Array) capable of being divided into units for every function so as to be configured.

Patent Document 1: Japanese Laid-open Patent Publication No. 2001-186010

SUMMARY

A basic structure disclosed in the present invention provides a semiconductor device including a circuit information supply unit that supplies circuit information acquired from an outside of the semiconductor device; circuit configuration units that configure respective circuits based on the circuit information supplied from the circuit information supply unit; a specification unit that specifies whether to execute circuit configuration with respect to the circuit configuration unit; and a signal fixation unit that fixes values of signals outputted from the circuit configuration units to a designated value during a period at which the specified circuit configuration unit configures corresponding circuits based on the circuit information.

The object and advantages of the present invention will be realized and attained by means of the elements and combinations particularly pointed out in the claims.

It is to be understood that both the foregoing general description and the following detailed description are exemplary and explanatory and are not restrictive of the present invention as claimed.

BRIEF DESCRIPTION OF DRAWINGS

FIGS. 20A and 20B are diagrams for illustrating the programs stored in the configuration ROM for reconfiguration and the circuit configuration in the FPGA;

DESCRIPTION OF EMBODIMENTS

Figure 1:
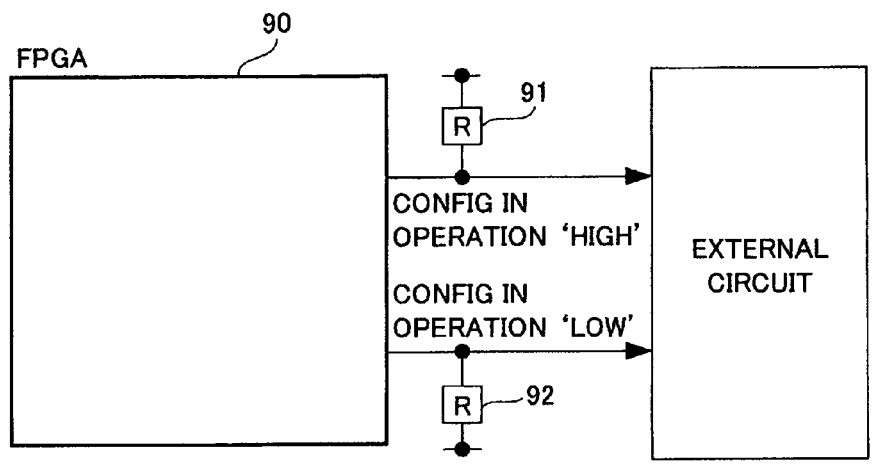
FIG. 1 is a diagram illustrating a related art FPGA and its peripheral circuit.

Generally, execution of various information processing with information processing apparatuses has become widespread in computer systems. For example, an information processing apparatus that functions as a server communicates with a client connected to the server via a network and provides the client with information and information processing services as requested. Further, in information processing, a hardware circuit executes processing in order to reduce the load of a processor that executes specific processing with software. For example, in applications where a server executes a specific application that requests encryption processing, a dedicated hardware circuit on which are mounted semiconductor devices having dedicated circuits is caused to execute the encryption processing to accelerate the processing.

As a semiconductor device that realizes high speed processing with a hardware circuit and facilitates the modification of processing information, a FPGA (Field Programmable Gate Array) has been known. The FPGA configures its internal circuits with circuit data imported from, for example, an external ROM (Read Only Memory). Further, for example, as a system for executing encryption processing, a common key encryption system as represented by the DES (Data Encryption Standard) and a public key encryption system as represented by the RSA have been known. For example, a known server communicates with plural clients to execute transaction processing during the daytime and communicates with a specific apparatus to execute batch processing during the nighttime. For example, such a server executes RSA Rivest, Shamir and Adelman) encryption processing related to the authentication of the clients and hash function processing for detecting tampering in the transaction processing, and process information mainly encrypted with the DES in the batch processing. In such a server, circuit data corresponding to a DES processing circuit and circuit data corresponding to an RSA processing circuit are prepared, for example, in the FPGA that executes encryption processing, and the internal circuits of the FPGA are reconfigured to update its processing information in the breakpoint of an operation. Thus, it is possible to deal with the plural types of processing while effectively using the FPGA. The reconfiguration of the circuits inside the FPGA is effective not only for changing the key system of encryption but also for updating the algorithm of encryption processing. For example, particularly for the common key encryption system, just as the algorithm of the DES constituted as the standard encryption in the United States has been replaced by the AES (Advanced Encryption Standard) to deal with degraded security with the advancement of technology, an algorithm may be updated as occasion demands. Furthermore, the reconfiguration of the circuits is effective for improving problems in the circuits configured inside the FPGA and resolving problems in the peripheral circuits of the FPGA.

Meanwhile, in the FPGA, the internal circuits become undefined, and the external connection terminals of the FPGA other than some control signal terminals are set to a high impedance (Hi-Z) state during the reconfiguration of the circuits. Consequently, this gives rise to a problem in which the peripheral circuits of the FPGA erroneously recognize the values of signals and an entire apparatus including the FPGA and the peripheral circuits malfunctions.

In order to prevent the apparatus from malfunctioning, any of the following measures may be taken.

Measure (1): During the configuration of circuits, an entire apparatus including a FPGA is reset.

Measure (2): During the configuration of circuits, peripheral circuits within a range affected by a FPGA are reset.

Measure (3): For example, as illustrated in FIG. 1, a pull-up resistor 91 or a pull-down resistor 92 is connected to the external terminal of a FPGA 90.

Figure 2:
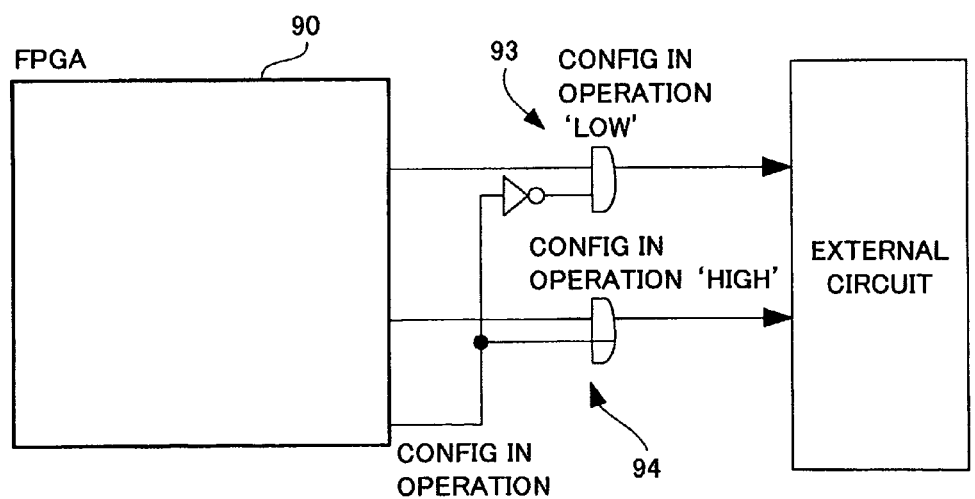
FIG. 2 is a diagram illustrating another related art FPGA and its peripheral circuit.

Measure (4): For example, as illustrated in FIG. 2, circuits 93 and 94 are provided that fix the values of signals output from a FPGA to an external circuit in response to a signal indicative of the period of reconfiguration.

Measure (5): A pull-up resistor or a pull-down resistor connected to an external terminal is provided inside a FPGA.

Moreover, although not directed to preventing the malfunction of an apparatus, a FPGA has been known that divides a region where circuits are configured into plural blocks, configures some of the blocks in parallel, and operates the circuits in the order in which the configuration has been completed. With this FPGA, the initializing operations of some of the blocks and the external circuits connected to the blocks are started prior to completing the entire configuration of the blocks. Therefore, an initializing processing time including the configuration is apparently reduced. In addition, the initializing processing time is also reduced by configuration executed in parallel.

However, according to the above measure (1) in which the entire apparatus is reset, the entire apparatus is reset every time the circuits are reconfigured. The same applies to a case where the apparatus does not cause the configured circuits to execute processing. For example, in the case of updating an encryption algorithm, a server is required to stop all its processing and be reset by restarting even if the server does not execute encryption processing. Accordingly, for example, the internal circuits of the FPGA cannot be reconfigured during the operation of the server, which in turn restricts a time for reconfiguring the circuits. Further, according to the above measure (2) in which the peripheral circuits are reset, the range of the peripheral circuits to be reset becomes large depending on the configurations of the peripheral circuits. For example, in applications where general-purpose LSIs (Large Scale Integrated circuits) and the like are connected to the peripheral circuits, the entire LSIs and the peripheral circuits are also required to be reset. Further, according to the measures (3) and (4), the components such as the external resistors or the logic circuits are required, and even arrangement regions of the components are secured on circuit boards. Further, according to the above measure (5), the pull-up resistor or the pull-down resistor inside the FPGA to be used has a high resistance value so as not to affect the outputs of signals in normal operations of the FPGA. However, if a resistance value is high, a time constant as the product of the resistance value and a capacitance value also becomes large and the fixation of a signal level with a resistor is time-consuming. Therefore, since the value of a signal is not recognized as a target value by an external circuit, the apparatus may malfunction.

Moreover, in the FPGA that operates the circuits in the order in which the configuration has been completed, the time of the configuration is apparently reduced. However, since the configuration is executed with respect to all the blocks, an undefined period due to the configuration still remains in the FPGA as a whole. As for the signals of the external terminal in this FPGA, the above measures (1) through (5) are eventually required to be taken.

Hereinafter, a description is made of embodiments of a semiconductor device, an information processing circuit board, an information processing apparatus, and encryption equipment disclosed in the present invention.

(First Embodiment)

Figure 3:
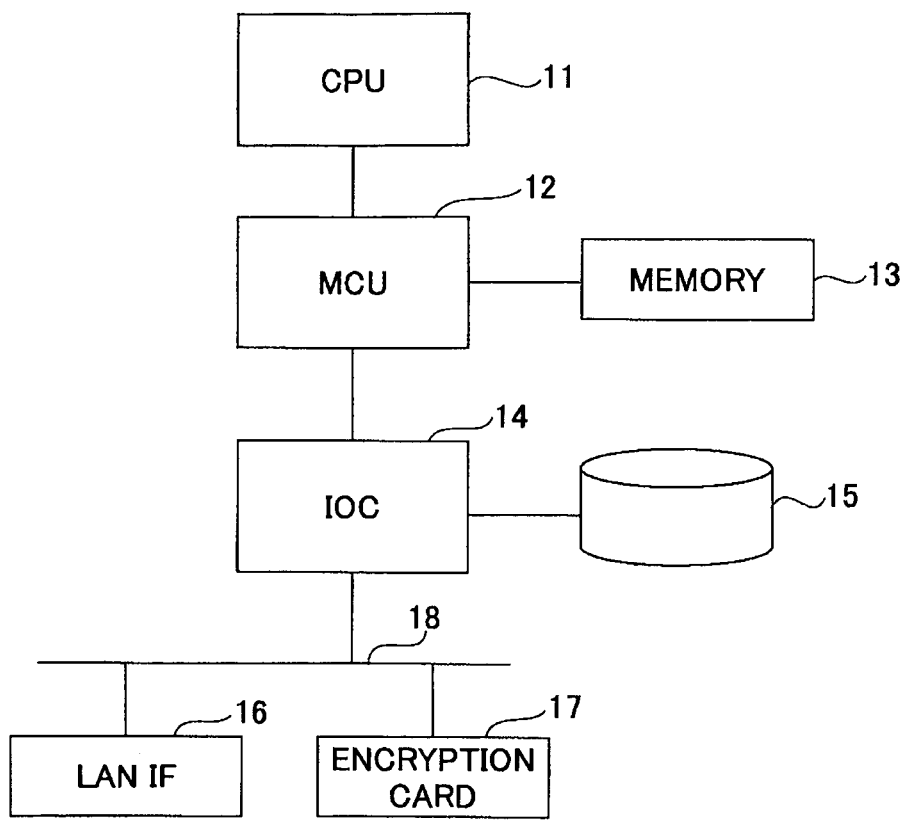
FIG. 3 is a block diagram illustrating the hardware configuration of a computer system as a specific first embodiment of an information processing apparatus.

FIG. 3 is a block diagram illustrating the hardware configuration of a computer system as a specific first embodiment of the information processing apparatus.

A computer system 100 illustrated in FIG. 3 has a CPU (Central Processing Unit) 11, a MCU (Memory Control Unit) 12, a memory 13, an IOC (Input/Output Controller) 14, an auxiliary storage unit 15, a LAN (Local Area Network) interface 16, and an encryption card 17.

The CPU 11 executes a computer program to control the operations of respective units in the computer system 100. The memory 13 temporarily stores the computer program executed by the CPU 11 and data. The auxiliary storage unit 15 is, for example, a hard disk unit and stores the computer program and the data. The MCU 12 controls the memory 13, and the IOC 14 controls the auxiliary storage unit 15 having an access speed lower than the memory 13. The IOC 14 is connected to the LAN interface 16 and the encryption card 17 via a PCI (Peripheral Component Interconnect) bus 18. The IOC 14 in this embodiment exchanges data with the LAN interface 16 and the encryption card 17 based on the standard of the PCI bus 18. The LAN interface 16 is a unit that communicates with computer systems (not illustrated) other than the computer system 100. The computer system 100 illustrated in FIG. 3 functions as a so-called server and provides the other computer systems network-connected via the LAN interface 16 with requested information.

Figure 4:
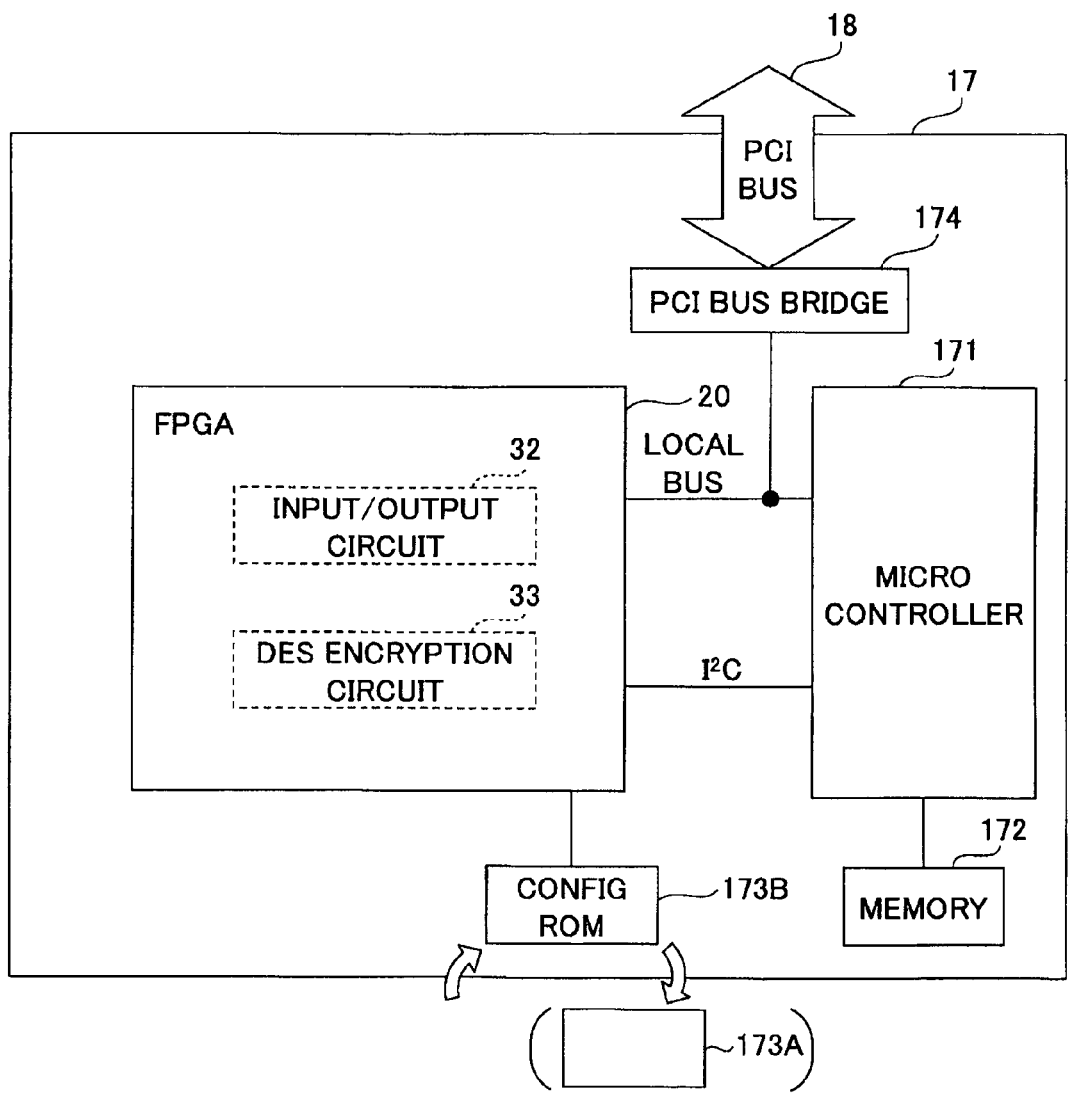
FIG. 4 is a block diagram illustrating the hardware configuration of an encryption card illustrated in FIG. 3.

FIG. 4 is a block diagram illustrating the hardware configuration of the encryption card illustrated in FIG. 3.

The encryption card 17 illustrated in FIG. 4 has a micro controller 171, a memory 172, a configuration ROM 173B, a PCI bus bridge 174, and a FPGA 20. Note that in the following description, "configuration" is abbreviated as "config." For example, the configuration ROM is abbreviated as a config ROM. Here, the encryption card 17 corresponds to an example of an information processing circuit board in the above basic structure. Further, the config ROM 173B corresponds to an example of a storage unit in the above basic structure.

The PCI bus bridge 174 is connected to the IOC 14 (see FIG. 3) via the PCI bus 18, and converts the bus protocols of a PCI bus and a local bus and exchanges data with the IOC 14. The PCI bus bridge 174, the FPGA 20, and the micro controller 171 are connected to one another via the local bus in the encryption card 17. Further, the micro controller 171 and the FPGA 20 are connected to each other via an I2C (Inter-Integrated Circuits) bus.

The FPGA 20 is a semiconductor device capable of configuring circuits corresponding to programs imported from an outside. When being instructed by the micro controller 171 to configure the circuits, the FPGA 20 imports config data (circuit data) from the config ROM 173 connected to the FPGA 20 to configure the circuits. In the FPGA 20 of this embodiment, circuits for executing encryption processing are configured.

The micro controller 171 supplies information required by the circuit to execute processing to the circuits configured in the FPGA 20. More specifically, the micro controller 171 holds key data required to execute encryption processing and supplies the key data to the FPGA 20. Further, simultaneously when instructing the FPGA 20 to start configuring the circuits, the micro controller 171 specifies which of the plural regions of the FPGA 20 executes the configuration of the circuits. The memory 171 stores the computer programs executed by the micro controller 171. The micro controller 171 executes corresponding functions in accordance with the computer programs stored in the memory 172.

The config ROM 173B stores the config data (circuit data) indicating which circuits are to be configured in the FPGA 20. In the following description, the config data are referred to as programs so as to be distinguished from data processed by the configured circuits. In the initial state of the encryption card 17, a first config ROM 173A is connected to the FPGA 20. The first config ROM 173A stores programs configuring an input/output circuit and a DES encryption circuit. The FPGA 20 configures an input/output circuit 32 and a DES encryption circuit 33 in accordance with the programs read from the first config ROM 173A.

In applications where the DES encryption circuit is updated, the first config ROM 173A is replaced by the second config ROM 173B. The second config ROM 173B stores programs indicating an AES encryption circuit. FIG. 4 illustrates a state in which the input/output circuit 32 and the DES encryption circuit 33 are configured in the FPGA 20 and the second config ROM 173B related to the AES encryption circuit is attached to the FPGA 20. When the FPGA 20 imports the programs from the second config ROM 173B to reconfigure the circuits in the state illustrated in FIG. 4, the DES encryption circuit is updated with the AES encryption circuit.

(Encryption Processing Unit)

Here, prior to describing the hardware of the FPGA, a description is made of the outlines of encryption processing equipment configured in the computer system 100 and encryption processing.

Figure 5:
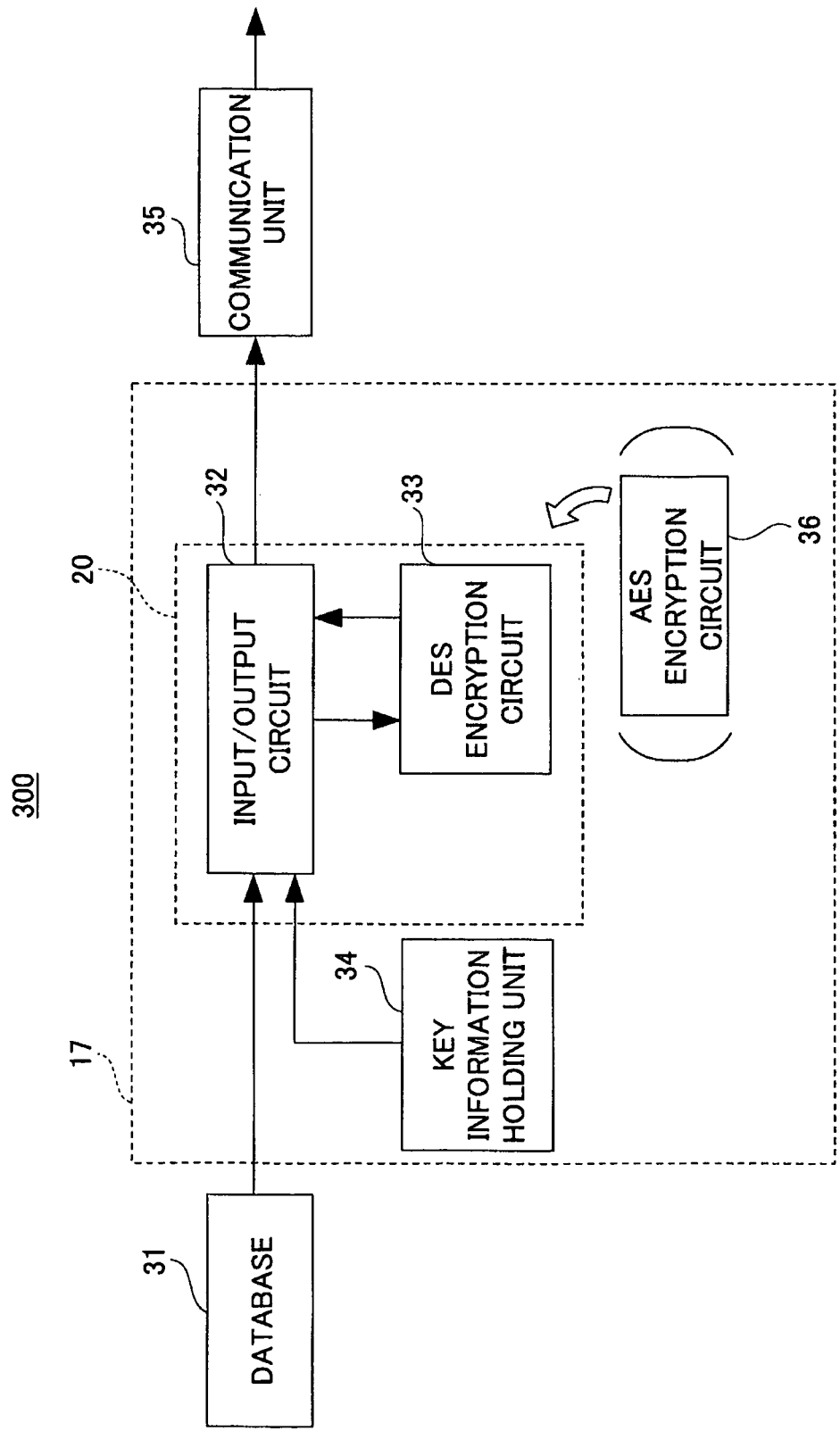
FIG. 5 is a block diagram illustrating the function blocks of encryption processing equipment configured in the computer system illustrated in FIG. 3.

FIG. 5 is a block diagram illustrating the function blocks of the encryption processing equipment configured in the computer system illustrated in FIG. 3.

Encryption processing equipment 300 illustrated in FIG. 5 is equipment that provides a computer system (not shown) externally connected to the encryption processing equipment 300 with encrypted data and has a database 31, the input/output circuit 32, the DES encryption circuit 33, a key information holding unit 34, and a communication unit 35.

The database 31 stores data to be provided to the external computer system and supplies the data to the input/output circuit 32. The input/output circuit 32 inputs the data supplied from the database 31 to the DES encryption circuit 33, receives the data processed by the DES encryption circuit 33, and outputs the data to the communication unit 35. Further, the input/output circuit 32 executes buffer processing to temporarily hold the data depending on the status of the data processed by the DES encryption circuit 33. The key information holding unit 34 holds the key data required to execute encryption and supplies key data to the DES encryption circuit 33 via the input/output circuit 32. The DES encryption circuit 33 encrypts the data received from the input/output circuit 32 according to the DES algorithm. The communication unit 35 transmits the encrypted data to the external computer system.

The database 31 is made operable by the combination of the CPU 11, the IOC 14, and the auxiliary storage unit 15. The input/output circuit 32 and the DES encryption circuit 33 are configured by the FPGA 20. The key information holding unit 34 is made operable by the micro controller 171 and the memory 172. Further, the communication unit 35 is made operable by the CPU 11, the IOC 14, and the LAN interface 16.

In the encryption processing equipment 300, the data stored in the database 31 are encrypted by the DES encryption circuit 33 and transmitted from the communication unit 35. Further, in the encryption processing equipment 300 of this embodiment, the DES encryption circuit 33 is updated with an AES encryption circuit 36 having higher encryption strength as requested.

Here, a description is made of the outlines of the encryption processing by the two encryption circuits.

Figure 6:
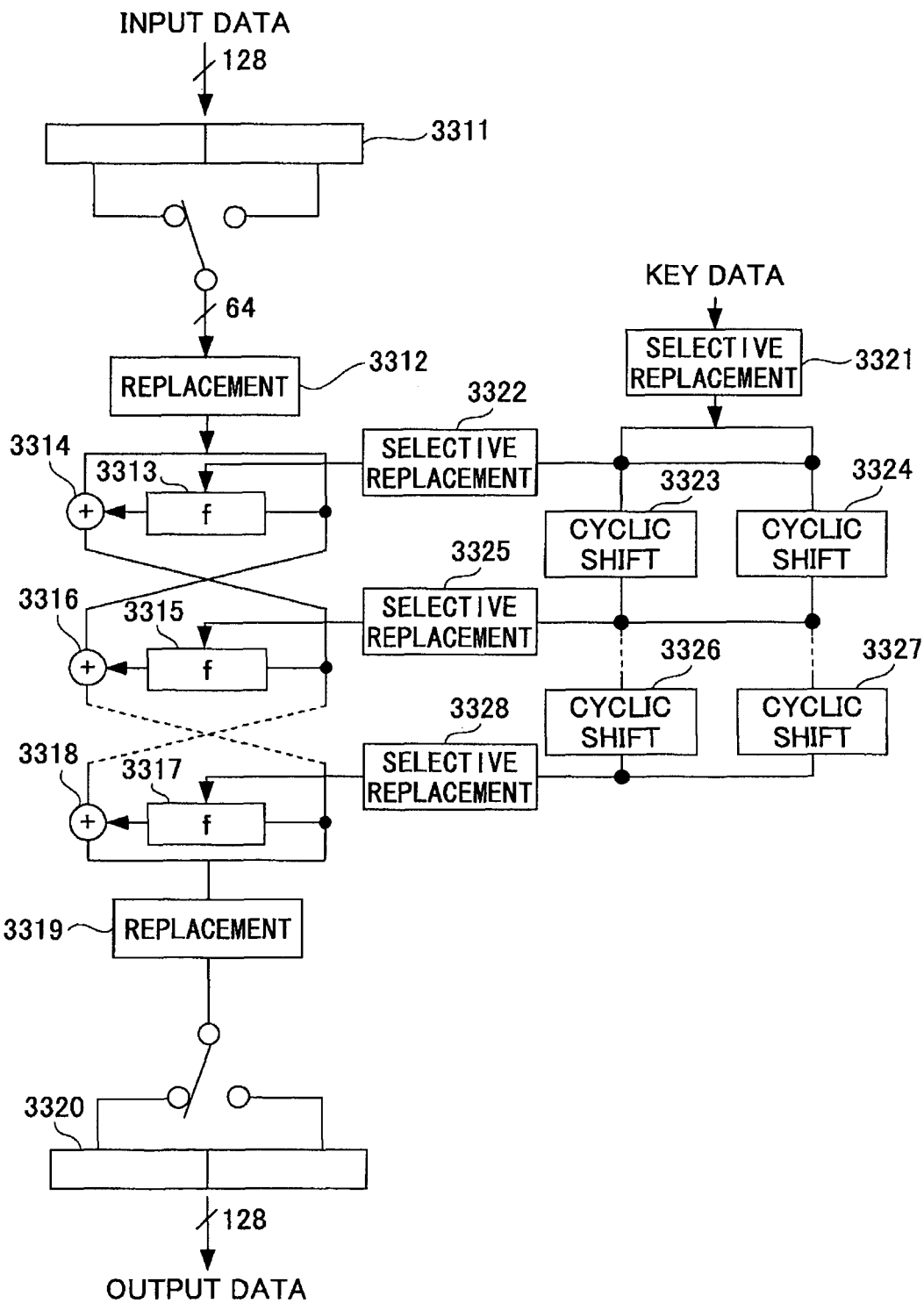
FIG. 6 is a block diagram for illustrating encryption processing by a DES encryption circuit.
Figure 7:
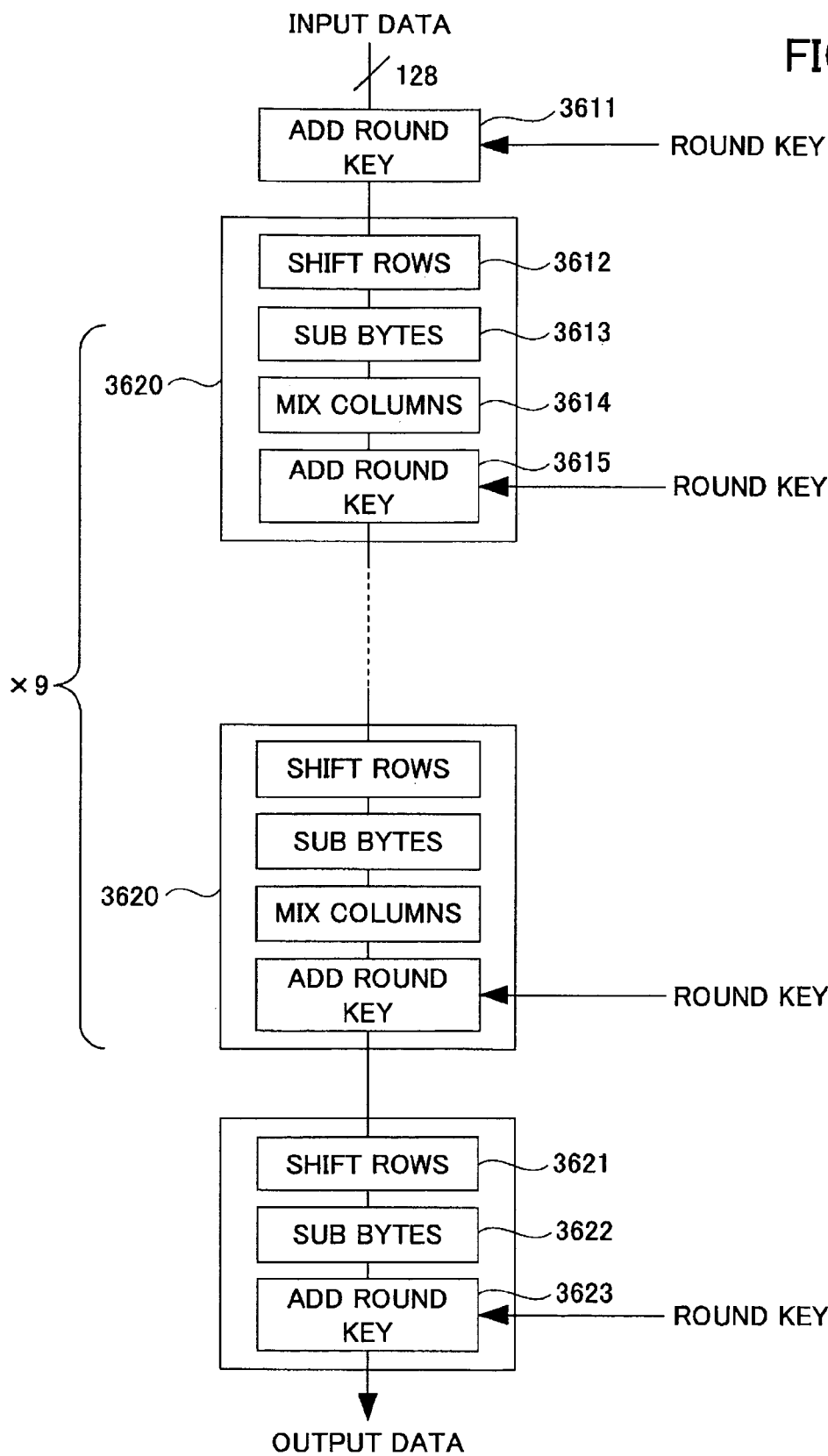
FIG. 7 is a block diagram for illustrating encryption processing by an AES encryption circuit.

FIG. 6 is a block diagram for illustrating the encryption processing by the DES encryption circuit, and FIG. 7 is a block diagram for illustrating the encryption processing by the AES encryption circuit.

The DES encryption circuit 33 illustrated in FIG. 6 encrypts the input data based on the key data and outputs the encrypted data as output data.

In the DES encryption circuit 33, the data input to a register 3311 in a 128-bit unit are fetched and processed at every 64 bits. The data fetched from the register 3312 are rearranged every bit unit by a replacement unit 3311. On the other hand, the key data are divided into the upper bit data of 28 bits on an upper side and the lower bit data of 28 bits on a lower side after 56 bits excluding parity are replaced by a selective replacement unit 3321. The upper bit data and the lower bit data are repeatedly subjected to left cyclic shifts by cyclic shift units 3323, 3324, 3326, and 3327 and rearrangement by selective replacement units 3322, 3325, and 3328 by 16 stages. The outputs of the selective replacement units 3322, 3325, and 3328 at the respective stages are used as round keys.

The data rearranged by the replacement unit 3312 are divided into upper bit data and lower bit data. An f processing unit 3313 executes a first rearrangement, an operation of an exclusive OR with the round key, a replacement of a value in plural-bit units, and a second rearrangement with respect to the lower bit data. An exclusive OR 3314 takes an exclusive OR between the upper bit data and data resulting from the processing by the f processing unit 3313. Next, the upper bit data and the lower bit data are replaced by each other, and processed by an f processing unit 3315 and an exclusive OR 3316. The replacement of the upper bit data and the lower bit data and the processing by the f processing units and the exclusive OR are repeatedly executed by the 16 stages. Finally, data obtained by combining the upper bit data and the lower bit data with each other are further rearranged by a replacement unit 3319 and input to a register 3320. The data are output from the register 3320 in the 128-bit units.

In the AES encryption circuit 36 illustrated in FIG. 7, an add round key unit 3611 takes an exclusive OR between the input data of 128 bits and the round key generated from the key data. Note that the detailed description of generating the round key by the AES is omitted. Data resulting from processing by the add round key unit 3611 are successively processed by a series-connected nine-stage round processing unit 3620. The round processing unit 3620 is composed of a shift rows 3612 that turns data into a 4×4 byte matrix and cyclically shifts respective rows; a sub bytes 3613 that applies affine transformation to the multiplication inverse element of an input; a mix columns 3614 that outputs a count obtained by calculating a specific polynomial equation of a polynomial equation where the elements of the respective rows in the matrix are counted; and an add round key 3615 that takes an exclusive OR between the input data of 128 bits and the round key. Finally, output data are output after being subjected to processing by a shift rows 3621, a sub bytes 3622, and an add round key 3623. The DES and the AES encryption algorithms themselves are publicly known, and therefore their further descriptions are omitted.

Like the DES, the AES is encryption processing using a secret encryption key system and a block encryption system. However, the AES is a system chosen and constituted as a new encryption standard from among the public in the United States in order to deal with the degraded security of the DES and has higher encryption strength than the DES. Accordingly, when the DES encryption circuit 33 is updated with the AES encryption circuit 36, confidentiality in data output from the encryption processing equipment 300 is enhanced.

(FPGA Hardware)

Next, a description is made of the hardware of the FPGA capable of configuring the encryption circuit and the input/output circuit.

Figure 8:
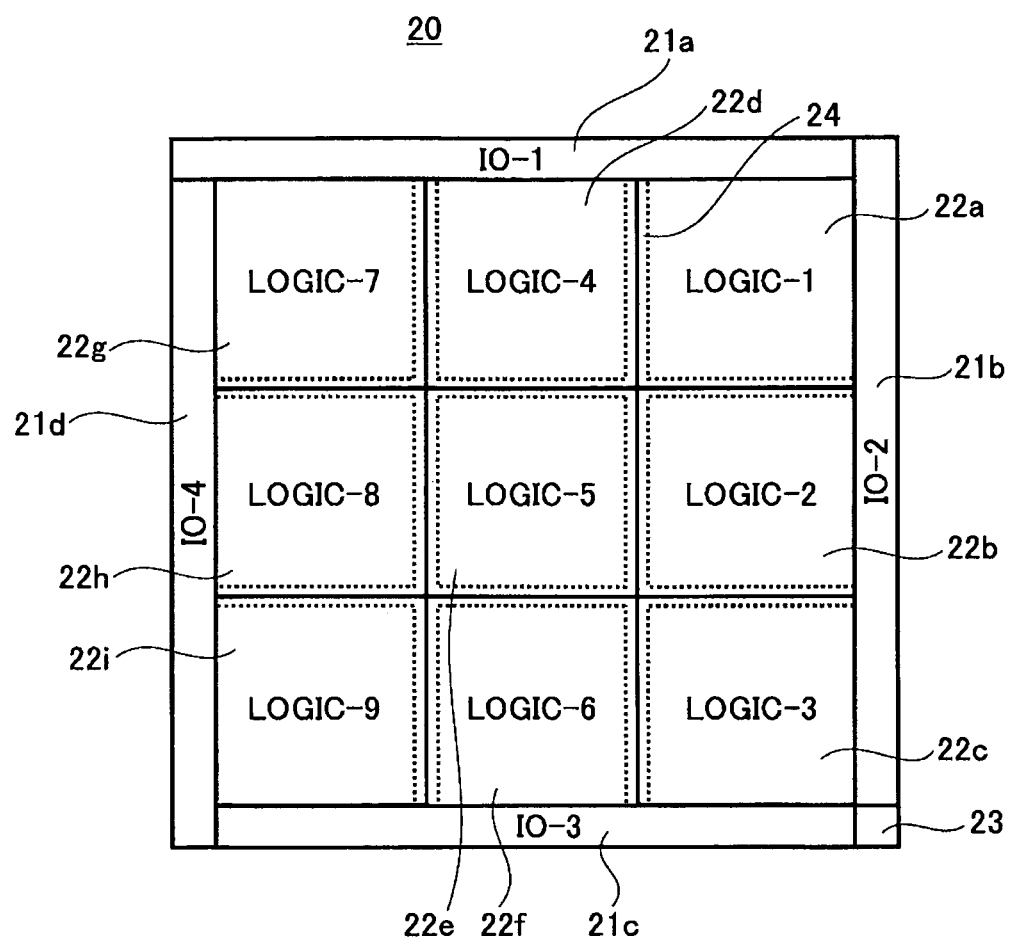
FIG. 8 is a block diagram illustrating the hardware configuration of the FPGA.

FIG. 8 is a block diagram illustrating the hardware configuration of the FPGA.

The FPGA 20 illustrated in FIG. 8 has four input/output units 21 (21a, 21b, 21c, and 21d) as represented by an IO-1, an IO-2, and IO-3, and an IO-4, respectively; nine logic configuration units 22 (22a, 22b, 22c, 22d, 22e, 22f, 22g, 22h, and 22i) as represented by a logic-1, a logic-2, a logic-3, a logic-4, a logic-5, a logic-6, a logic-7, a logic-8, and a logic-9, respectively; a control unit 23; and a signal fixation unit 24.

The input/output units 21 determine the inputs/outputs of external connection terminals connected to the external circuits of the FPGA 20, and the logic configuration units 22 configure logic circuits.

The control unit 23 controls the configuration of the circuits in the input/output unit 21 and the logic configuration unit 22. More specifically, the control unit 23 reads the programs for circuit configuration stored in the config ROM 173 (see FIG. 4) and supplies them to the input/output units 21 and the logic configuration units 22. The programs stored in config ROM 173 are a set of the programs corresponding to the respective input/output units 21 and the logic configuration units 22. The logic configuration units 22 configure the logic circuits in accordance with the programs, and the input/output units 21 configure connection circuits connected to the external connection terminals. The FPGA 20 of this embodiment is capable of specifying whether to execute the circuit configuration with respect to each of the four input/output units 21 and the nine logic configuration units 22.

During the period at which the control unit 23 reads the programs and supplies them to the input/output units 21 and the logic configuration units 22, the signal fixation unit 24 fixes the values of signals exchanged between the input/output units 21 and/or the logic configuration units 22 where the circuit configuration is executed and between the input/output units 21 and/or the logic configuration units 22 where the circuit configuration is not executed.

Here, the input/output units 21 and the logic configuration units 22 correspond to examples of the circuit configuration units in the above basic structure.

Figure 9:
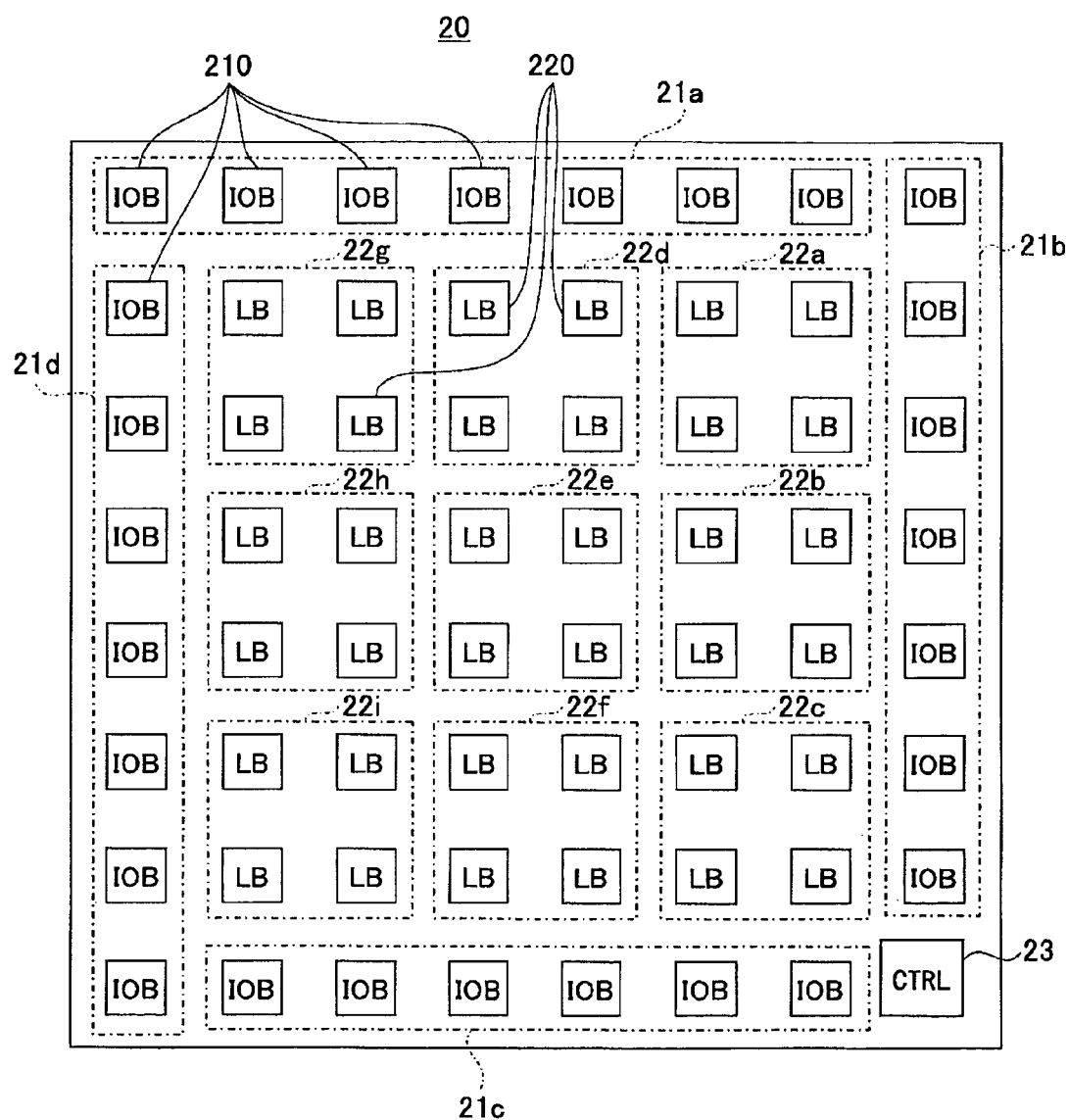
FIG. 9 is a block diagram illustrating the hardware configuration of the FPGA in further detail.

FIG. 9 is a block diagram illustrating the hardware configuration of the FPGA in further detail.

Each of the input/output units 21 has plural input/output blocks (IOB) 210, and each of the logic configuration units 22 has plural logic blocks (LB) 220. The input/output blocks 210 are provided corresponding to the external connection terminals and determine the inputs/outputs of the respective external connection terminals. The logic configuration units 22 correspond to the minimum logic function of the FPGA 20. Note that in the FPGA 20, the input/output blocks 210 are provided corresponding to the number of the external connection terminals and the logic blocks 220 are provided corresponding to the size of the circuits handled by the FPGA 20. However, in FIG. 9, in order to enhance the viewability of the structure, only six or seven of the input/output blocks 210 are illustrated for each of the input/output units 21, and only four of the logic blocks 220 are illustrated for each of the logic configuration units 22.

Figure 10:
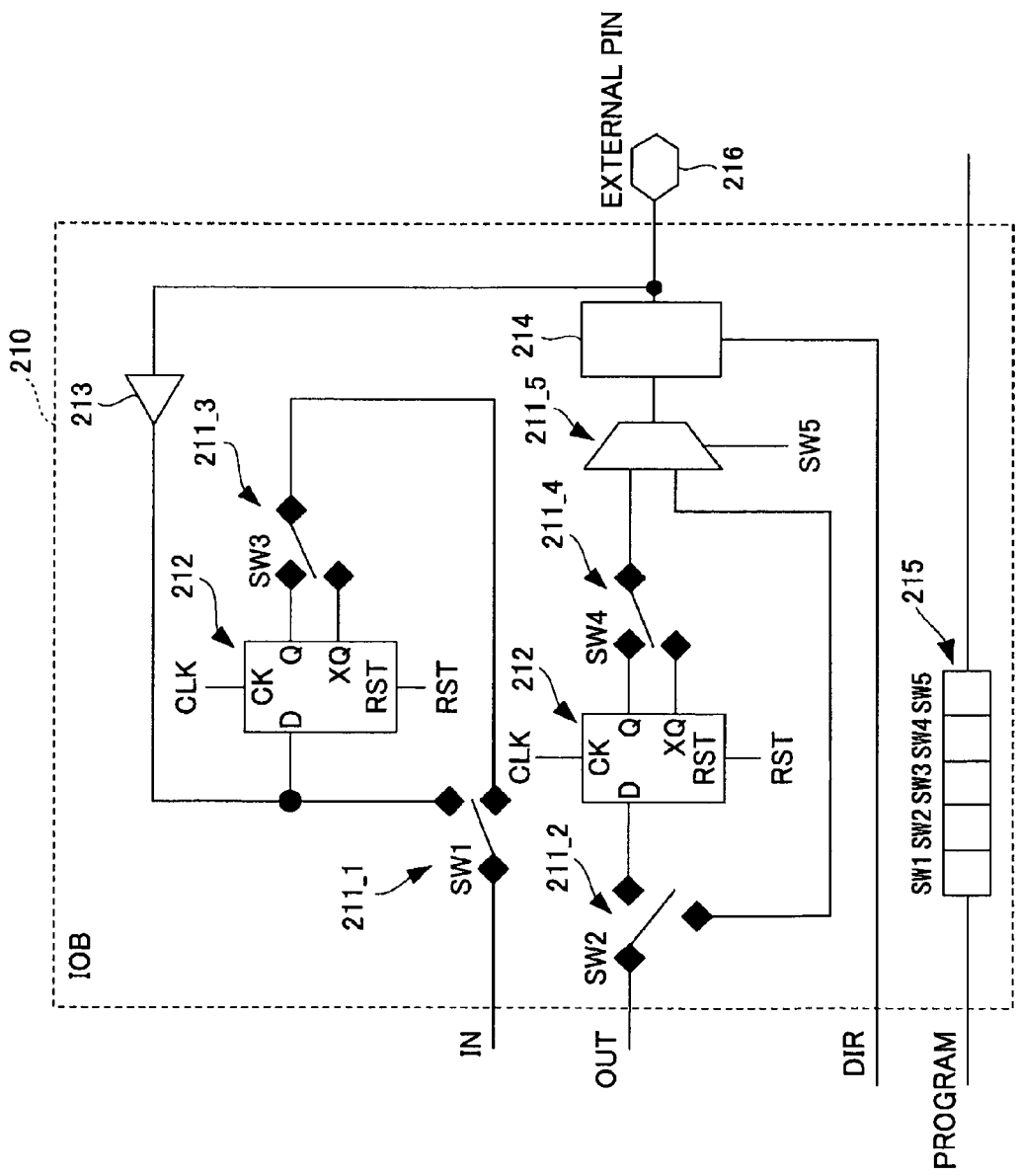
FIG. 10 is a circuit diagram illustrating the internal configuration of an input/output block illustrated in FIG. 9.

FIG. 10 is a circuit diagram illustrating the internal configuration of the input/output block illustrated in FIG. 9.

The input/output block 210 has switches 211_1 through 211_5 (SW1 through SW5), a data latch 212, an input buffer 213, an output part 214, and a selection control part 215. The selection control part 215 is composed of a shift register, and the programs are input to the selection control part 215. The selection control parts 215 of the plural input/output blocks 210 illustrated in FIG. 9 are connected in series to one another, and the programs are successively exchanged between the selection control parts 215 of the plural input/output blocks 210 at the circuit configuration. Finally, the input of the programs to each of to the selection control parts 215 of the input/output blocks 210 is stopped in a state where a part of the programs corresponding to the input/output block 210 is held. In other words, the selection control part 215 illustrated in FIG. 10 holds the part of the programs corresponding to the input/output block 210 involved. The selection of the switches 211_1 through 211_5 is made according to the values held in the bits of the selection control part 215, and then the circuits connected to the external connection terminal (external PIN) 216 are configured. The configured circuits determine the input/output of the external connection terminal 216 and determine whether signals are synchronized with clocks in the input/output block 210.

Figure 11:
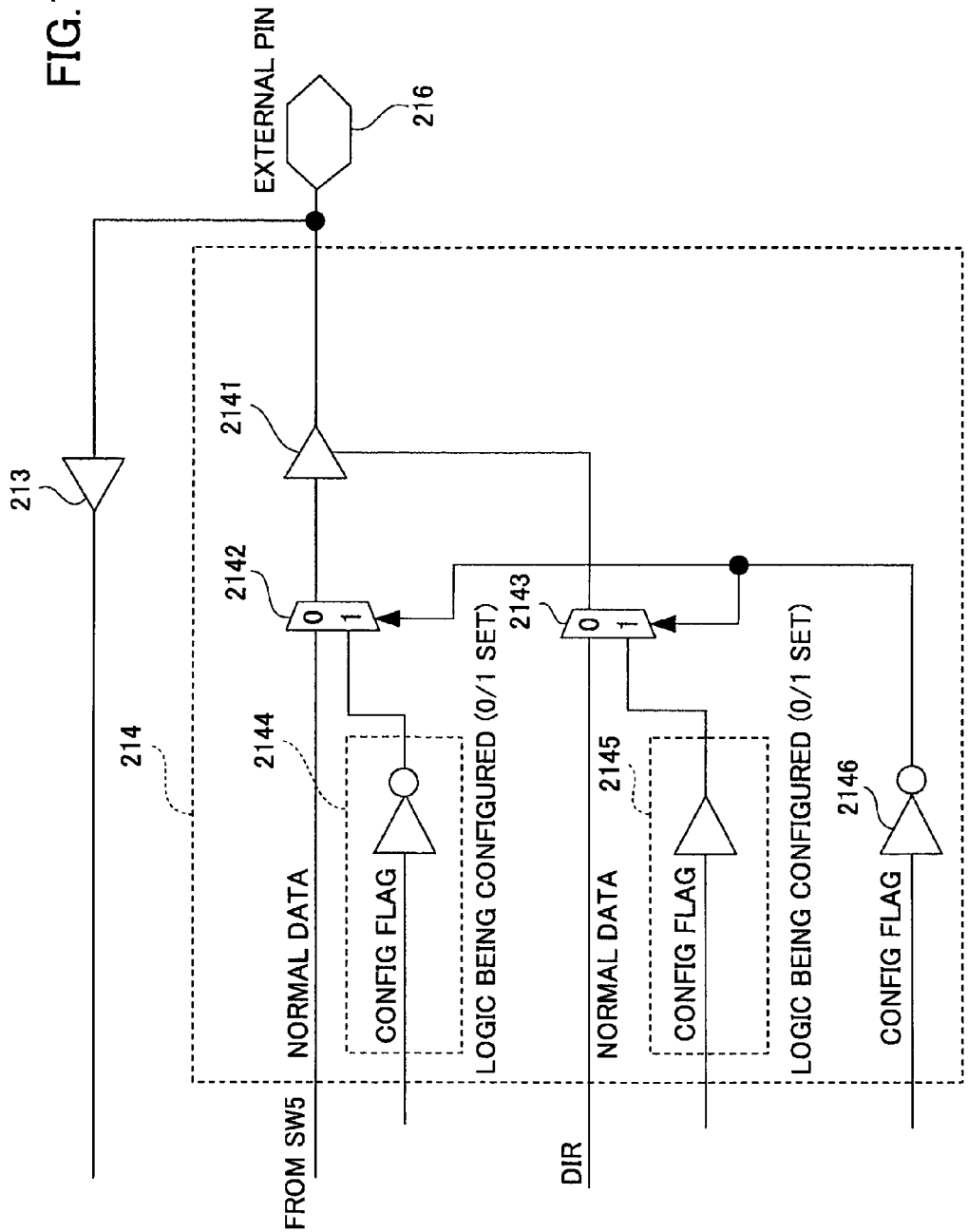
FIG. 11 is a circuit diagram illustrating the internal configuration of an output unit in the input/output block illustrated in FIG. 10.

FIG. 11 is a circuit diagram illustrating the internal configuration of the output part in the input/output block 210 illustrated in FIG. 10.

The output part 214 has an output buffer 2141, selectors 2142 and 2143 that select signals, and logic circuits 2144 and 2145 composed of an inverter or a buffer. To the logic circuits 2144 and 2145 are input config flag signals from an outside. If the value of the config flag signal is "0," it indicates that the circuit configuration is executed in the input/output unit 21 including the output part 214. If the value is "1," it indicates that the circuit configuration is not executed and the input/output unit 21 normally operates. In the output part 214, if the value of the config flag signal is "1," i.e., if the circuit configuration is not executed, the status of the external connection terminal 216 is determined in accordance with a DIR signal used to determine an input/output and the output of the switch 211_5 (see FIG. 10). On the other hand, if the value of the config flag signal is "0," i.e., if the circuit configuration is executed in the input/output unit 21, the status of the external connection terminal 216 is determined in accordance with the logic circuits 2144 and 2145. In the case of the logic circuits 2144 and 2145 illustrated in FIG. 11, the external connection terminal 216 is fixed to the value of "1" during the period at which the circuit configuration is executed in the input/output unit 21.

Figure 12:
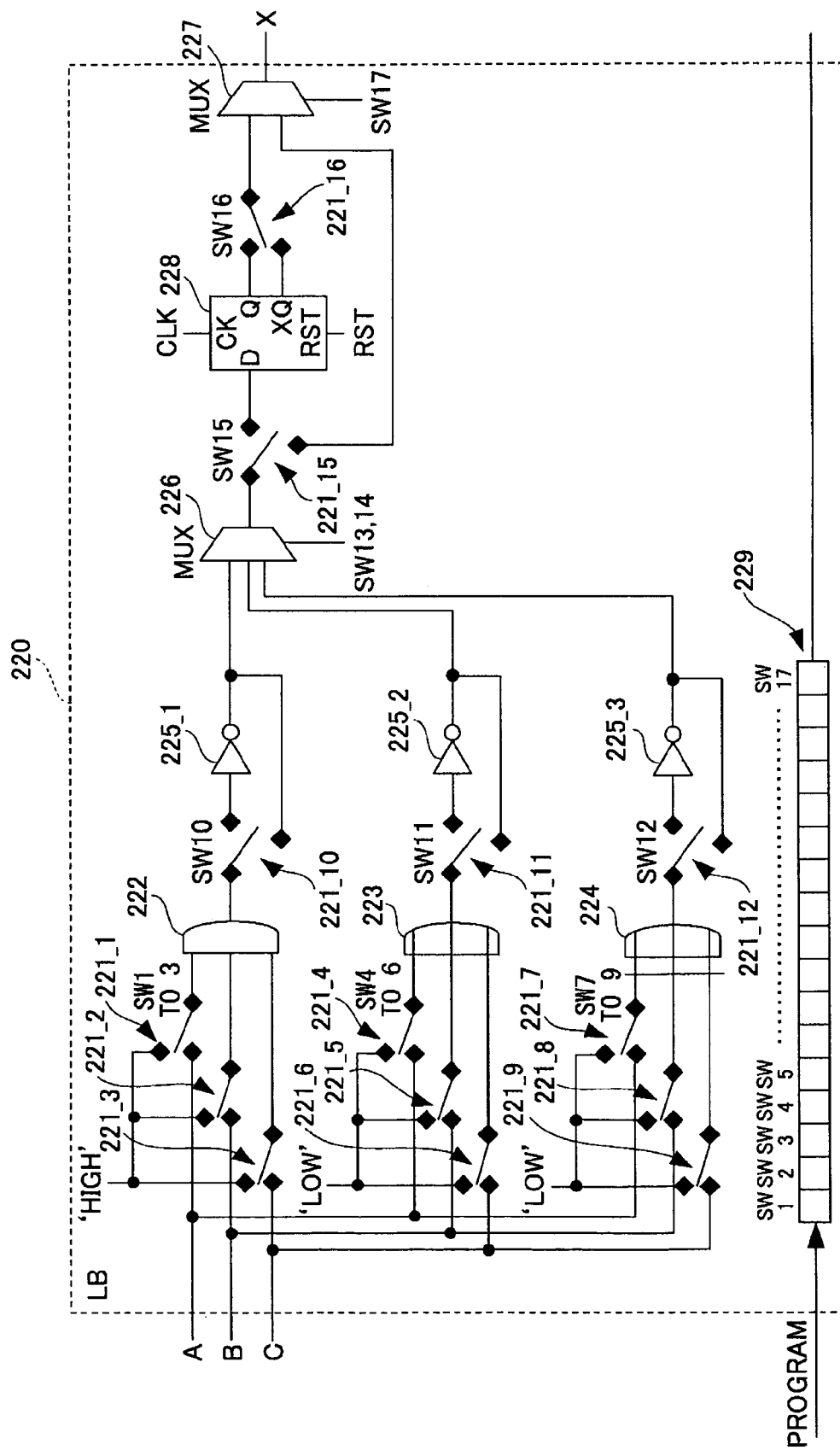
FIG. 12 is a circuit diagram illustrating the internal configuration of a logic block illustrated in FIG. 9.

FIG. 12 is a circuit diagram illustrating the internal configuration of the logic block illustrated in FIG. 9.

The logic block 220 has switches 221_1 through 221_16 (SW1 through SW16) that select signals, an AND gate 222, an OR gate 223, an XOR gate 224, inverters 225_1, 225_2, and 225_3, multiplexers 226 and 227, a data latch 228, and a selection control part 229.

The selection control part 229 is composed of a shift register, and the programs are input to the selection control part 229. The selection control parts 229 of the plural logic blocks 220 illustrated in FIG. 9 are connected in series to one another, and the programs are successively exchanged between the selection control parts 229 of the plural logic blocks 210 at the circuit configuration. Finally, the input of the programs to each of the selection control parts 229 of the logic blocks 220 is stopped in a state where a part of the programs corresponding to the logic block 220 is held. In other words, the selection control part 229 illustrated in FIG. 12 holds the part of the programs corresponding to the logic block 220 involved. The selection of the switches 221_1 through 221_16 is made according to the values held in the bits of the selection control part 229, and then the logic circuits are configured. More specifically, the selection of the switches 221_1 through 221_16 determines which of the input signals A, B, and C is used, which of the logic gates AND, OR, and XOR is used, and whether signals are latched by the data latch 228.

The input/output block 210 illustrated in FIG. 10 is provided with the output part 214 that fixes the status of the external connection terminal 216 during the period at which the circuit configuration is executed. On the other hand, the logic block 220 uses the signal fixation unit 24 (see FIG. 8) to fix the signals exchanged between the logic configuration units 22.

Figure 13:
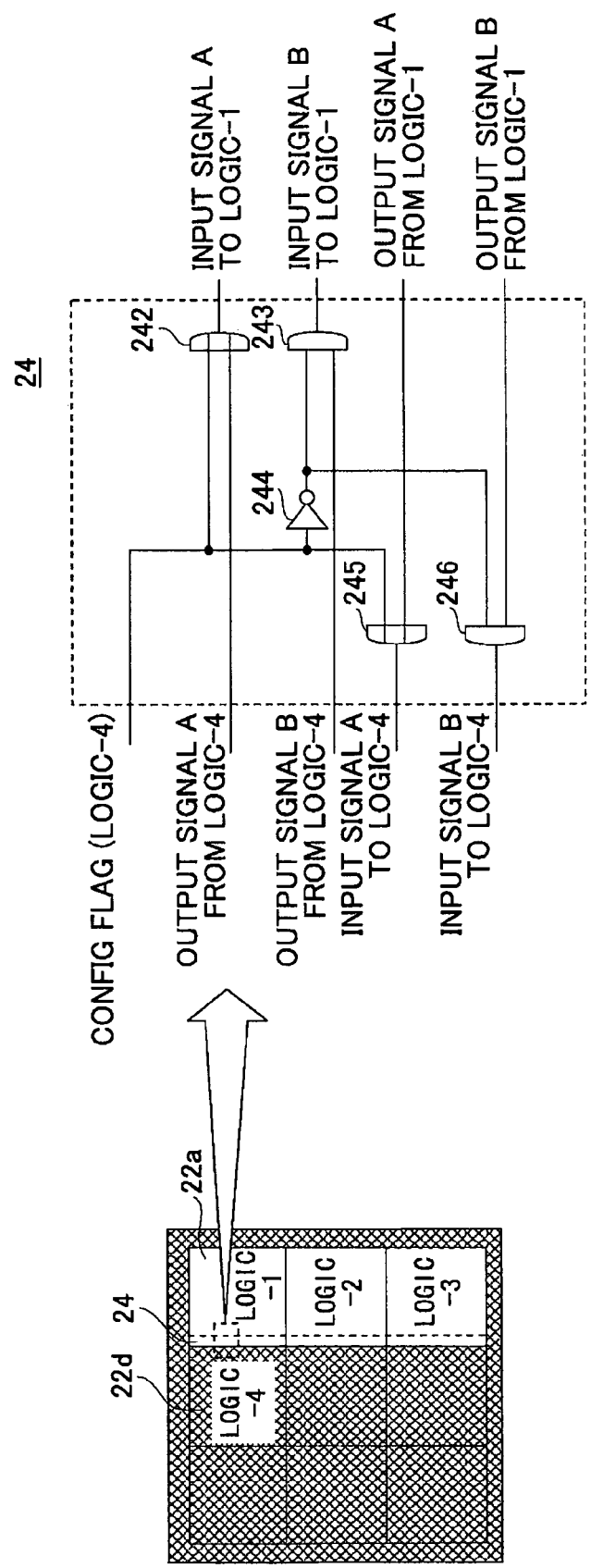
FIG. 13 is a circuit diagram illustrating the internal configuration of a signal fixation unit.

FIG. 13 is a circuit diagram illustrating the internal configuration of the signal fixation unit.

The signal fixation unit 24 transmits the signals exchanged between the logic configuration units 22 at a normal operation in which the circuit configuration is not executed. Note that FIG. 13 illustrates the configuration of the signal fixation unit 24 by exclusively using a part where the signals are exchanged between the logic configuration unit (logic-1) 22a and the logic configuration unit (logic-4) 22d. This configuration of the signal fixation unit 24 illustrated in FIG. 13 is also provided between the other logic configuration units 22.

The signal fixation unit 24 has plural types of logic gates 241, 242, 243, 244, 245, and 246. During the period at which the logic configuration units specified to execute the circuit configuration configure the circuits, the signal fixation unit 24 fixes the signals output from the logic configuration units. More specifically, during the period at which the FPGA 20 executes the circuit configuration, the signal fixation unit 24 fixes the values of the signals exchanged between the logic configuration units where the circuit configuration is executed and the logic configuration units where the circuit configuration is not executed. For example, if the value of the config flag signal (config flag (logic-4)) corresponding to the logic configuration unit (logic-4) 22d is "0" that indicates the execution of the circuit configuration, the values of the signals supplied from the logic configuration unit (logic-4) 22d to the logic configuration unit (logic-1) 22a are fixed to "1" or "0." For example, the value of the input signal A to the logic configuration unit (logic-1) 22a as the output of the OR gate 242 is fixed to "1." On the other hand, the value of the input signal B as the output of the AND gate 243 is fixed to "0." Thus, the values of the signals, which are output from the logic configuration unit (logic-4) 22d where the circuit configuration is executed to the logic configuration unit (logic-1) 22a where the circuit configuration is not executed, are fixed to the prescribed values. Accordingly, transmission of the undefined state of the signals from the logic configuration unit (logic-4) 22d to the logic configuration unit (logic-1) 22a due to the circuit configuration is prevented, and the circuit configured in the logic configuration unit (logic-1) 22a can continue its operations.

The signal fixation unit 24 also fixes the values of the signals input from the logic configuration unit (logic-1) 22a where the circuit configuration is not executed to the logic configuration unit (logic-4) 22d where the circuit configuration is executed. For example, the value of the input signal A to the logic configuration unit (logic-4) 22d is fixed to "1," while the value of the input signal B is fixed to "0."

Here, each of the output part 214 of the input/output block 210 and the signal fixation unit 24 corresponds to an example of the signal fixation unit in the above basic structure.

Next, a description is made of the control unit 23 that controls the circuit configuration.

Figure 14:
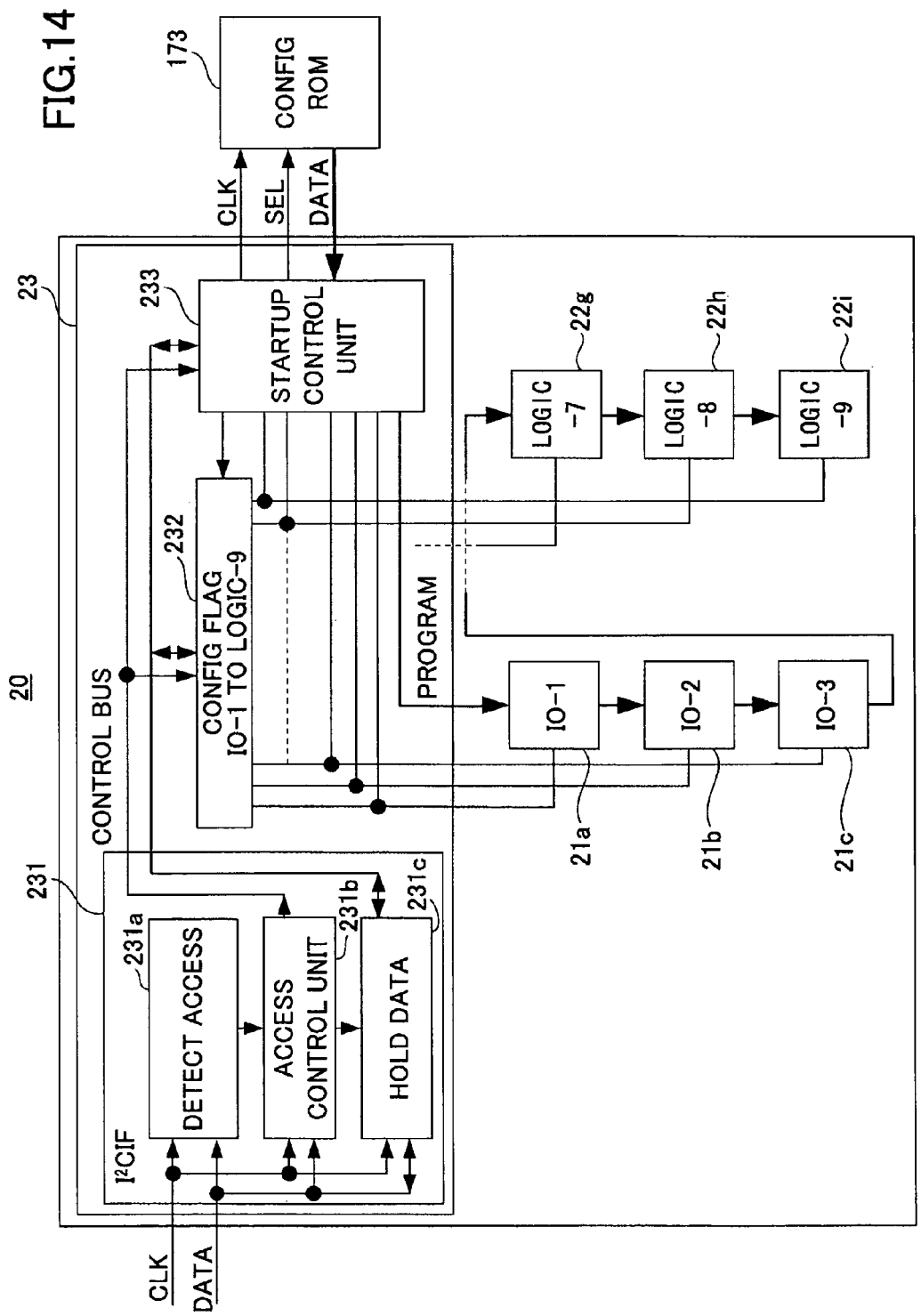
FIG. 14 is a block diagram illustrating the hardware configuration of the FPGA as well as the details of a control unit.

FIG. 14 is a block diagram illustrating the hardware configuration of the FPGA as well as the details of the control unit.

The control unit 23 of the FPGA 20 has an I2C interface (I2CIF) 231, a config flag register 232, and a startup control unit 233.

The I2C interface 231 communicates with the micro controller 171 (see FIG. 4) provided outside the FPGA 20 by using an I2C and receives setting information from the micro controller 171. The I2C interface 231 has an access detection part 231a, an access control part 231b, and a data holding part 231c. For example, the I2C interface 231 receives from the micro controller 171 the config flag data indicating whether to execute the circuit configuration for each of the input/output units 21 and the logic configuration units 22, and writes them in the config flag register 232. Further, the I2C interface 231 receives configuration start instruction information indicating the start of the circuit configuration from the micro controller 171. The configuration start instruction information is supplied to the startup control unit 233.

The config flag register 232 specifies whether to execute the circuit configuration for each of the input/output units 21 and the logic configuration units 22. The config flag register 232 holds the config flag data received via the I2C interface 231 and outputs the values of the respective bits of the config flag data during the circuit configuration.

The startup control unit 233 reads the programs stored in the config ROM 173 and supplies them to the input/output units 21 and the logic configuration units 22. The programs read from the config ROM 173 are a set of the programs corresponding to the respective input/output units 21 and the logic configuration units 22. Note that in FIG. 14, only three of the input/output units 21 and three of the logic configuration units 22 are illustrated. The four input/output units 21 and the nine logic configuration units 22 are connected in series to one another and successively hand over the supplied program between them. Inside the input/output units 21 and the logic configuration units 22, the shift registers constituting the selection control parts 215 and 229 (see FIGS. 10 and 12) of the logic blocks 220 and the input/output blocks 210 are connected in series to one another. The programs supplied from the startup control unit 233 are successively transmitted from the selection control parts 215 of the input/output unit (IO-1) 21a to the selection control part 229 of the logic configuration unit (logic-9) 22i. However, in the input/output units 21 and/or the logic configuration unit 22 where the non-execution of the circuit configuration is specified by the config flag register 232, the input programs are directly output to the subsequent stages without passing through the selection control parts 215 and 229.

Here, the config flag register 232 corresponds to an example of the specification unit in the above basic structure, and the startup control unit 233 corresponds to an example of a program supply unit in the above basic structure.

Figure 15:
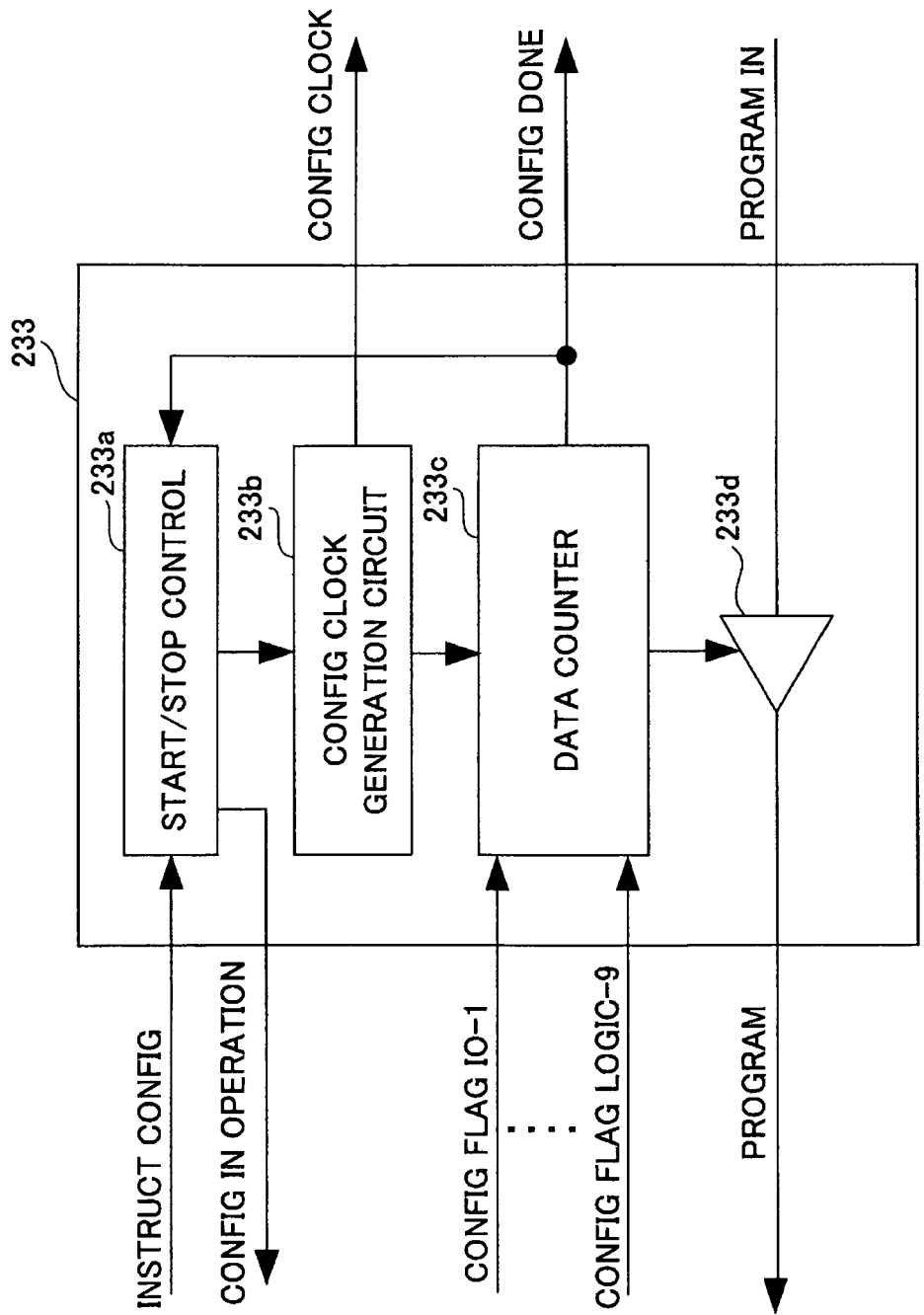
FIG. 15 is a block diagram illustrating the internal configuration of a startup control unit of the control unit.

FIG. 15 is a block diagram illustrating the internal configuration of the startup control unit of the control unit.

The startup control unit 233 has a start/stop control part 233a, a config CLK generation circuit 233b, a data counter 233c, and a data buffer 233d. The start/stop control part 233a receives a configuration start instruction with respect to the FPGA 20 and causes the config CLK generation circuit 233b to generate a clock (config clock). The clock is supplied to the config ROM 173 (see FIG. 14) as a read clock. The data counter 233c counts the number of the programs read from the config ROM 173 to read an appropriate amount of the programs. In the FPGA 20 of this embodiment, the execution or the non-execution of the circuit configuration is specified for each of the input/output units 21 and/or the logic configuration units 22, and the programs corresponding to input/output units 21 and/or the logic configuration units 22 where the circuit configuration is not executed are not read. Accordingly, the data counter 233c counts the number of the programs corresponding to the output of the config flag register 232 (see FIG. 14). After the config flag register 232 completes the counting, the start/stop control part 233a completes the read of the programs and stops the output of a config-in-operation signal. The data buffer 233d supplies the programs read from the config ROM 173 to the input/output unit (IO-1) 21a (see FIG. 14).

Figure 16:
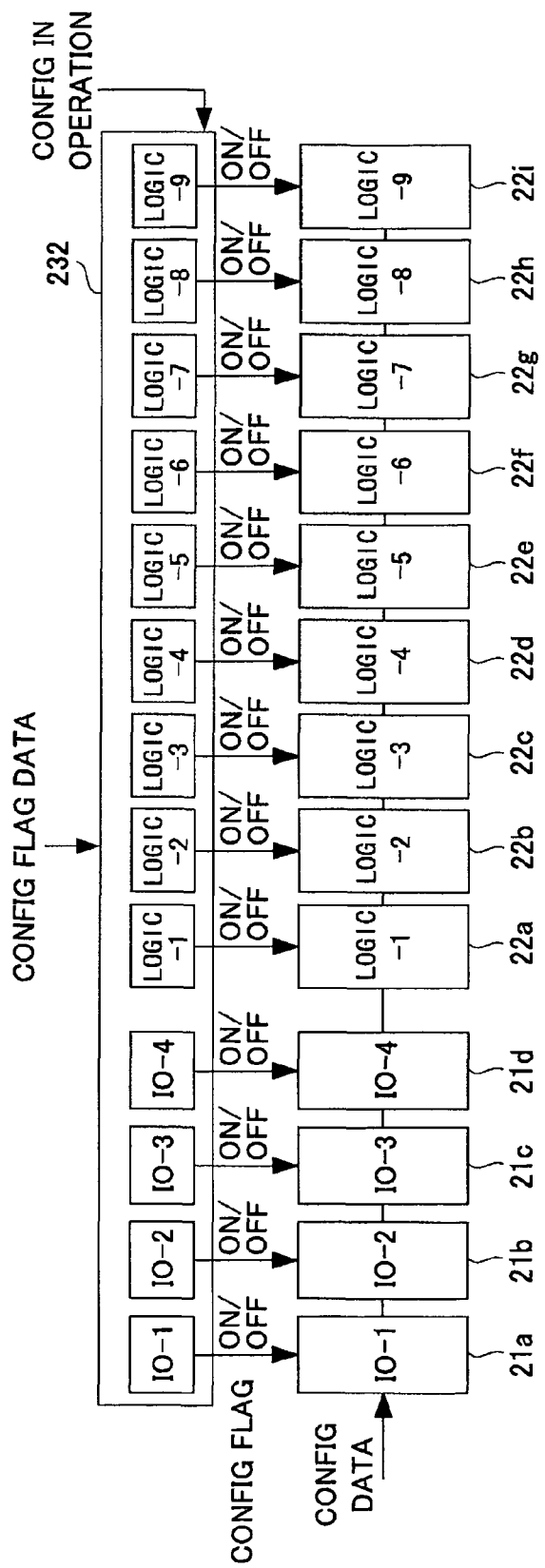
FIG. 16 is a block diagram illustrating a configuration flag register, input/output units, and logic configuration units.

FIG. 16 is a block diagram illustrating the config flag register, the input/output units, and logic configuration units.

The config flag register 232 holds the config flag data. The respective bits of the config flag data are output as the config flag signals corresponding to the four input/output units 21 and the nine logic configuration units 22. The execution or the non-execution of the circuit configuration is specified according to the values of the config flag signals. The value "0" of the config flag signals indicates the execution of the circuit configuration, while the value "1" indicates the non-execution of the circuit configuration. The initial values of the config flag signals of the config flag register 232 are all "0," indicating that the circuit configuration is executed in all the input/output units 21 and the logic configuration units 22. The config flag register 232 outputs the held values as the values of the config flags only when receiving the config-in-operation signal. Otherwise, the config flag register 232 outputs the value "1" indicating the non-execution of the circuit configuration.

Figure 17:
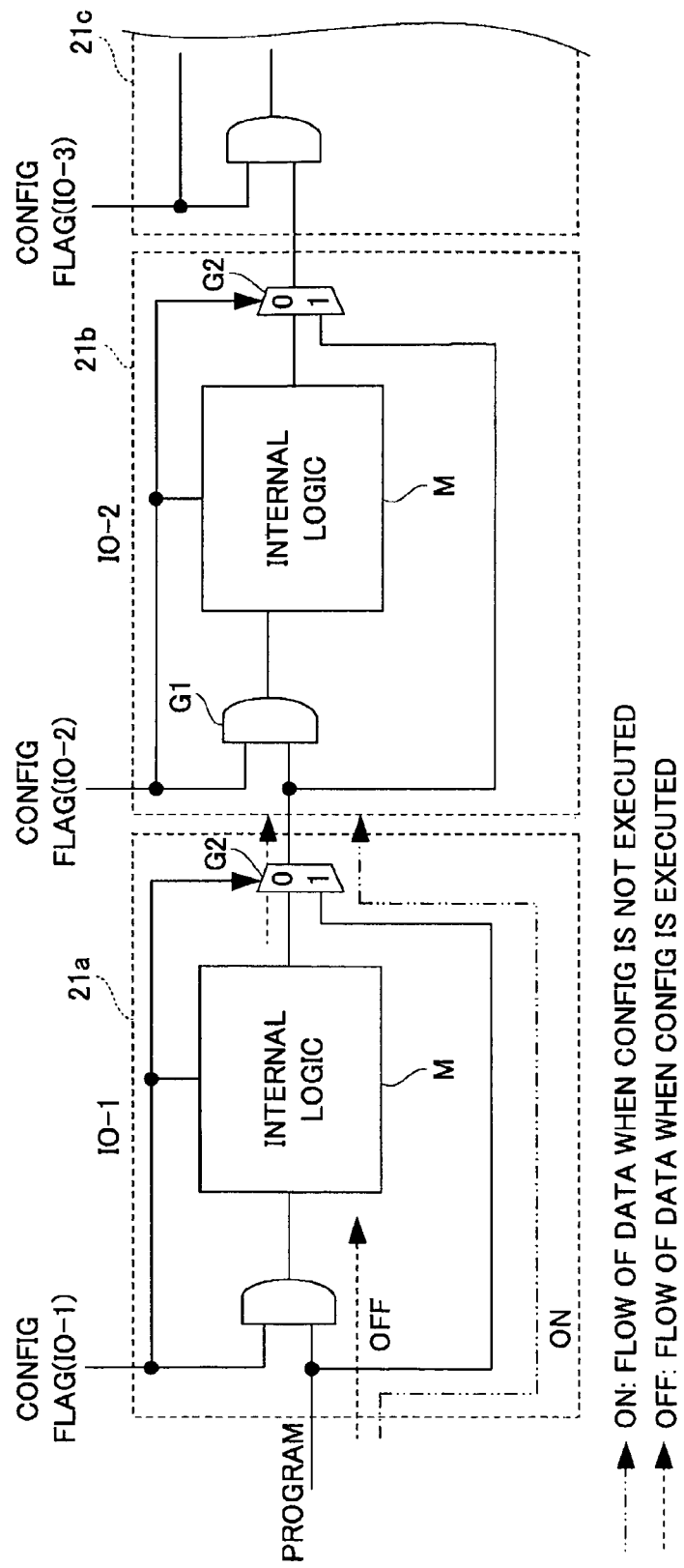
FIG. 17 is a diagram illustrating the paths of programs in the input/output units and the logic configuration units.

FIG. 17 is a diagram illustrating the paths of the programs in the input/output units and the logic configuration units. In FIG. 17, among the four input/output units 21 and the nine logic configuration units 22 of the FPGA 20, three of the input/output units 21 are illustrated as representative examples.

An internal logic M of the input/output unit (IO-1) 21a is composed of the plural input/output blocks 210 (see FIG. 9) belonging to the input/output unit (IO-1) 21a. More specifically, the internal logic M is configured such that the selection control parts 215 (see FIG. 10) of the input/output blocks 210 are connected in series to one another.

In the input/output unit (IO-1) 21a, an AND gate G1 and a selector G2 that control the paths of the programs are provided. If the value of the config flag signal (config flag (IO-1)) corresponding to the input/output unit (IO-1) 21a indicates "0," i.e., if the execution of the circuit configuration is indicated, the programs pass through the internal logic M (the path as indicated by "OFF") to execute the circuit configuration. On the other hand, if the value of the config flag signal indicates "1," i.e., if the non-execution of the circuit configuration is indicated, the programs are directly supplied to the subsequent input/output unit (IO-2) 21b (the path as indicated by "ON") without passing through the internal logic M.

Figure 18:
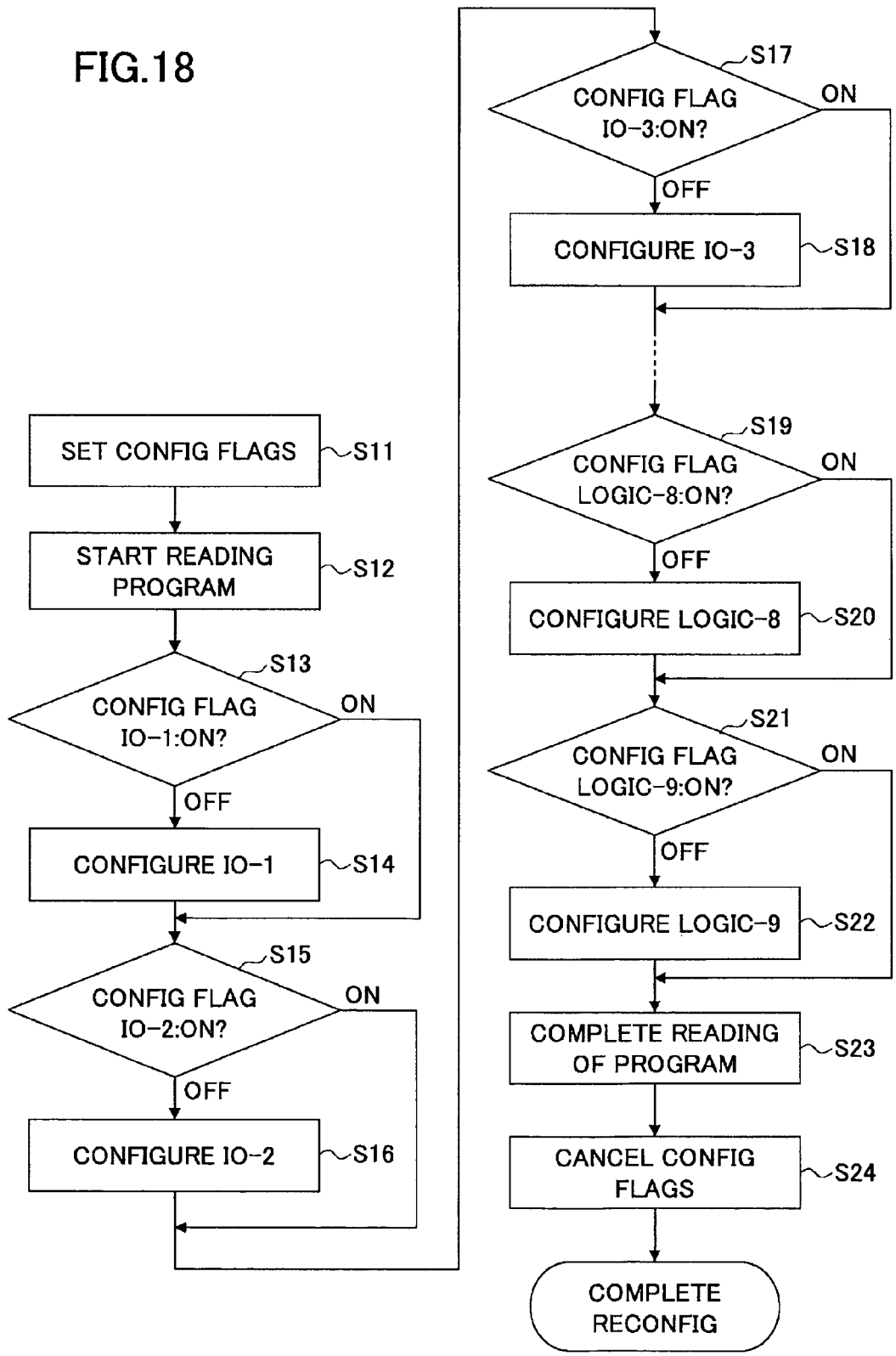
FIG. 18 is a flowchart for illustrating the operations of circuit configuration in the FPGA.

FIG. 18 is a flowchart for illustrating the operations of the circuit configuration in the FPGA.

The circuit configuration is started on the condition that the micro controller 171 (see FIG. 4) transmits the configuration start instruction information after transmitting the config flag data to the FPGA 20 via the I2C bus. The configuration start instruction information is input to the start/stop control part 233a of the startup control unit 233 (see FIG. 15) via the I2C interface 231. Thus, the startup control unit 233 outputs the config-in-operation signal, and then the values of the respective bits of the config flag data stored in the config flag register 232 are output as the config flag signals (step S11). Further, the startup control unit 233 reads the programs from the config ROM 173 and supplies them to the input/output units 21 and the logic configuration units 22.

If the execution of the circuit configuration is specified, that is, if the value of the config flag signal (config flag (IO-1)) involved is "OFF," i.e., "0" (OFF in step S13), the input/output unit (IO-1) 21a (see FIG. 17) causes the programs supplied from the startup control unit 233 to be input to the internal logic M to execute the circuit configuration (step S14). Further, if the circuit configuration is executed, the signal output to the external connection terminal 216 (FIG. 11) is fixed by the output part 214. On the other hand, if the non-execution of the circuit configuration is specified, that is, if the config flag (IO-1) is "ON," i.e., "1" (ON in step S13), the input/output unit (IO-1) 21a causes the supplied programs to be bypassed and handed over to the subsequent input/output unit (IO-2) 21b. The operations in the above steps S13 and S14 are similarly executed in the input/output units (IO-2) 21b through (IO-4) 21d and the logic configuration units (logic-1) 22a through (logic-9) 22i connected subsequent to the input/output unit (IO-1) 21a. Note that the signals, which are output from the logic configuration units 22 where the circuit configuration is executed to the logic configuration units 22 where the circuit configuration is not executed, and the signals, which are reversely output from the logic configuration units 22 where the circuit configuration is not executed to the logic configuration unit 22 where the circuit configuration is executed, are fixed by the signal fixation unit 24 (FIG. 13).

The processing steps from S13 to S22 are concurrently executed in each of the input/output units 21 and the logic configuration units 22.

When the reading of the programs from the config ROM 173 is completed, the circuit configuration is completed in the input/output units 21 and the logic configuration units 22 where the execution of the circuit configuration is specified (step S23). At this time, the startup control unit 233 stops the output of the config-in-operation signal, and the values of the config flag signals become "1" indicating the non-execution of the circuit configuration. That is, the settings of the config flags are cancelled (step S24). Thus, the fixation of the signals exchanged between the logic configuration units 22 is cancelled, and the signals of the configured circuits are output from the external connection terminals corresponding to the input/output units 21.

(Configuration and Reconfiguration of Encryption Equipment)

Next, the configuration and reconfiguration of the encryption circuit in the encryption processing equipment 300 (see FIG. 5) are described. Here, a description is made of an example in which only the DES encryption circuit is reconfigured as the AES encryption circuit in the FPGA 20 where the DES encryption circuit and the input/output circuit are configured.

First, as a premise of the reconfiguration, the configuration of the DES encryption circuit and the input/output circuit is described.

Figures 19A, 19B:
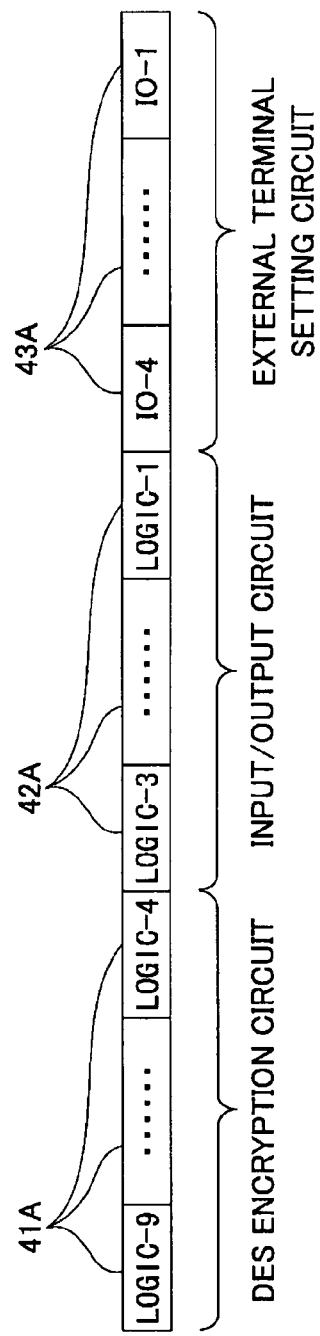
FIGS. 19A and 19B are diagrams for illustrating the programs stored in a configuration ROM and circuits configured in the FPGA.

FIGS. 19A and 19B are diagrams for illustrating the programs stored in the config ROM and the circuits configured in the FPGA. FIG. 19A illustrates the programs stored in the config ROM so as to be arranged in the order in which they are read from the config ROM.

A program 40A stored in the config ROM is a set of programs 41A, 42A, and 43A indicating the circuits configured in the four input/output units 21 and the nine logic configuration units 22 of the FPGA 20. The program 41A corresponding to the logic configuration units (logic-4) 22d through (logic-9) 22i indicate the DES encryption circuit illustrated in FIG. 6. Further, the program 42A corresponding to the logic configuration units (logic-1) 22a through (logic-3) 22c indicates the input/output circuit. Further, the program 43A corresponding to the input/output units (IO-1) 21a through (IO-4) 21d indicates the circuits for setting the statuses of the external connection terminals 216.

When the micro controller 171 specifies the execution of the circuit configuration with respect to all the logic configuration units 22 and the input/output units 21 to instruct the start of the circuit configuration in a state where the config ROM 173A storing the program 40A illustrated in FIG. 19A is installed in the encryption card 17 illustrated in FIG. 4, the FPGA 20 reads the program 40A from the config ROM 173A and configures the circuits inside it.

FIG. 19B illustrates a state in which the circuits are configured in the FPGA. In the logic configuration units (logic-4) 22d through (logic-9) 22i of the FPGA 20, the DES encryption circuit is configured. Further, in the logic configuration units (logic-1) 22a through (logic-3) 22c, the input/output circuit is configured. Further, in the input/output units (IO-1) 21a through (IO-4) 21d, the circuit that inputs/outputs the signals to the PCI bus bridge 174 and the micro controller 171 provided outside the FPGA 20 is configured. In the FPGA 20, after the completion of the circuit configuration, the input/output circuit 32 receives data to be encrypted and key data from the PCI bus bridge 174 and the micro controller 171 and supplies them to the DES encryption circuit 33 and then the DES encryption circuit 33 encrypts the data. The encrypted data are output to the PCI bus bridge 174 by the input/output circuit 32. With the circuit configuration of the FPGA 20, the encryption processing equipment 300 illustrated in FIG. 5 is completed.

Next, in applications where the DES encryption circuit 33 is updated with the AES encryption circuit, the config ROM is replaced to execute the circuit reconfiguration.

FIGS. 20A and 20B are diagrams for illustrating the programs stored in the config ROM for the reconfiguration and the circuit configuration in the FPGA.

FIG. 20A illustrates the programs stored in the config ROM 173B (see FIG. 4) so as to be arranged in the order in which they are read from the config ROM.

A program 40B is a set of programs 41B corresponding to the logic configuration units (logic-4) 22d through (logic-9) 22i among the four input/output units 21 and the nine logic configuration units 22 of the FPGA 20. The program 40B indicates the AES encryption circuit illustrated in FIG. 7.

In the circuit reconfiguration, the config ROM 173A (see FIG. 4) storing the program 40A illustrated in FIG. 19A is replaced by the config ROM 173B storing the program 40B illustrated in FIG. 20A, and the micro controller 171 specifies the execution of the circuit reconfiguration with respect to only the logic configuration units (logic-4) 22d through (logic-9) 22i while specifying the non-execution of the circuit reconfiguration with respect to the remaining logic configuration units (logic-1) 22a through (logic-3) 22c and the input/output units 21. According to the configuration start instruction from the micro controller 171, the circuit reconfiguration is executed.

At this time, in FIG. 16, the values of the config flags corresponding to the logic configuration units 22d through 22i become OFF, i.e., "0" indicating the execution of the circuit configuration, while the values of the config flags corresponding to the logic configuration units 22a through 22c and the input/output units 21 become ON, i.e., "1" indicating the non-execution of the circuit configuration. In this case, the circuits are configured in the logic configuration units 22d through 22i in accordance with the imported programs. However, in the logic configuration units 22a through 22c and the input/output units 21, the imported programs are directly output to the subsequent stages without being used for the circuit configuration. For example, in the input/output unit (IO-1) 21a illustrated in FIG. 17, the value of the config flag (IO-1) becomes ON indicating the non-execution of the circuit configuration, and the input programs are output without passing through the internal logic M.

FIG. 20B illustrates a state in which the circuit reconfiguration is being executed in the FPGA.

In the logic configuration units 22d through 22i of the FPGA 20, the circuit configuration is in operation and the internal logics become undefined. At this time, the signals, which are exchanged between the logic configuration units (22*d* through 22*i*) where the circuits are configured and the logic configuration units (22*a* through 22*c*) where the circuits are not configured, are fixed by the signal fixation unit 24. For example, in the signal fixation unit 24 illustrated in FIG. 13, the config flag (logic-4) that specifies the circuit configuration of the logic configuration unit (logic-4) 22*d* becomes OFF, and the values of the signals exchanged between the logic configuration unit (logic-4) 22*d* and the logic configuration unit (logic-1) 22*a* are fixed to "1" or "0." Note that the logic circuits are preferably configured such that the signals output from the logic configuration units (22*d* through 22*i*) where the circuit configuration is executed are connected by the signal fixation unit 24 to the logic gates 242 and 243 corresponding to the values "1" and "0" depending on the meanings of the circuits. For example, when the encryption circuit outputs a signal indicating whether data are acceptable, the signal is preferably connected to the logic gates 242 and 243 of the signal fixation unit 24 so as to be fixed to the value indicating that the data are not acceptable.

With the fixation of the signals, the input/output circuit 32 can continue the operations even in the circuit reconfiguration of the FPGA 20. The input/output circuit 32 cannot exchange data with the encryption circuit. However, for example, in response to an access from the PCI bus bridge 174, the input/output circuit 32 is capable of responding with information requesting for holding data because it cannot execute the encryption processing. Accordingly, the PCI bus bridge 174 and the micro controller 171 connected to the FPGA 20 are not required to be reset at the circuit reconfiguration of the FPGA 20.

Here, the DES encryption circuit 33 corresponds not only to an example of a first information processing circuit but also to an example of a first information encryption circuit in the above basic structure. Further, the AES encryption circuit 36 corresponds not only to an example of a second information processing circuit but also to an example of a second information encryption circuit in the above basic structure.

(Modification of Settings of External Connection Terminals)

In the above example of the reconfiguration, the circuit reconfiguration is not executed in the input/output units 21. However, in the FPGA 20 of this embodiment, it is possible to modify the settings of the external connection terminals with the execution of the circuit reconfiguration in the input/output units 21.

Figures 21A, 21B:
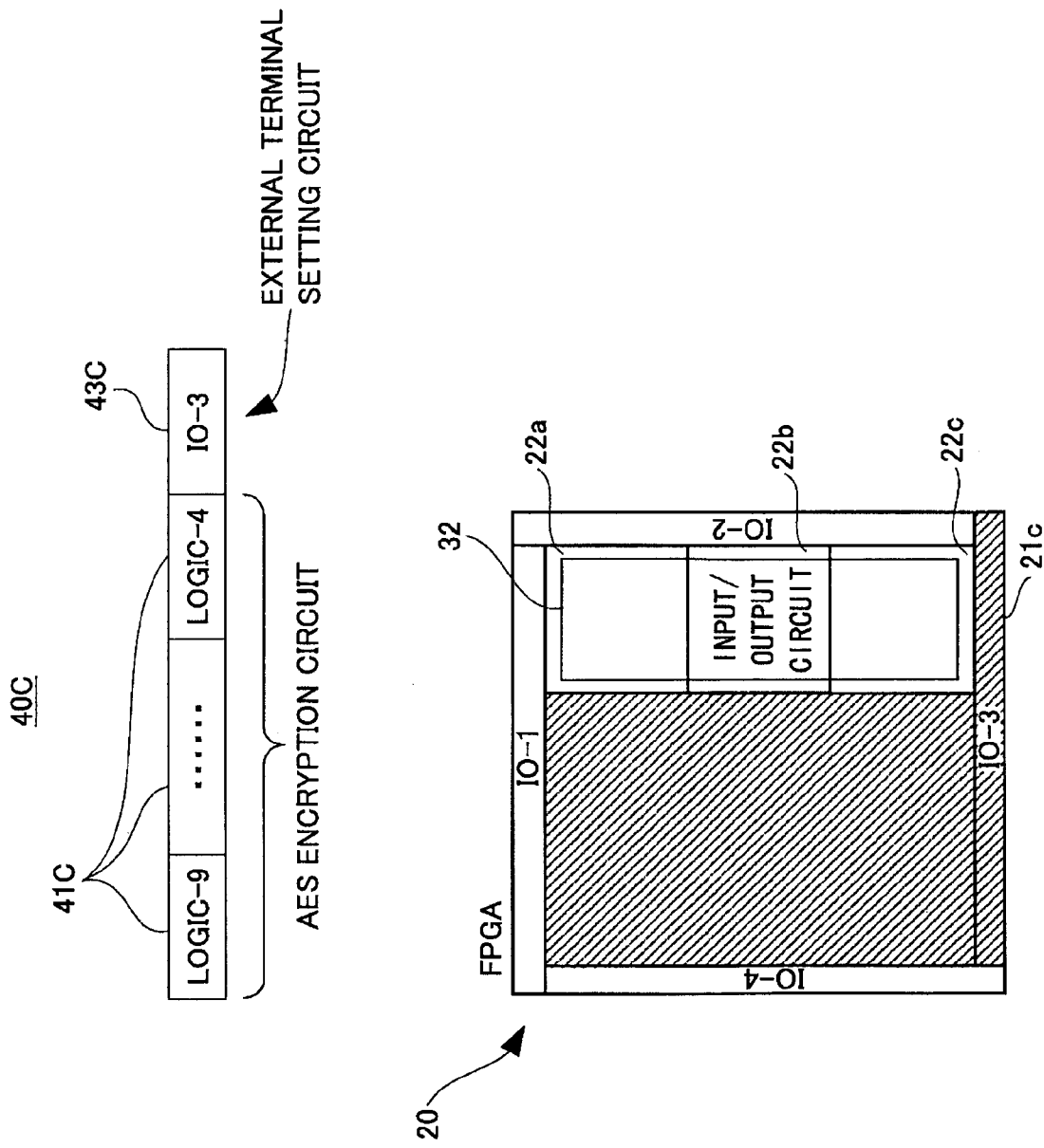
FIGS. 21A and 21B are diagrams for illustrating another programs stored in the configuration ROM for the reconfiguration and the circuit configuration in the FPGA.

FIGS. 21A and 21B are diagrams for illustrating another programs stored in the config ROM for the reconfiguration and the circuit configuration in the FPGA.

A program 40C illustrated in FIG. 21A contains the program of an external terminal setting circuit corresponding to the input/output unit (IO-3) 21*c* in addition to the programs of the AES encryption circuit 36 corresponding to the logic configuration units (logic-4) 22*d* through (logic-9) 22*i*.

In the example of the circuit reconfiguration illustrated in FIGS. 21A and 21B, the micro controller 171 specifies the execution of the circuit reconfiguration with respect to the logic configuration units (logic-4) 22*d* through (logic-9) 22*i* and the input/output unit (IO-3) 21*c*. In this case, in the logic configuration units 22*d* through 22*i* and the input/output unit (IO-3) 21*c*, the circuits are configured according to the imported programs.

FIG. 21B illustrates a state in which the circuit reconfiguration is being executed in the FPGA. In the input/output unit (IO-3) 21*c* of the FPGA 20, the circuit is being configured. At this time, the config flag signal "0" is input to the output part 214 (see FIG. 11) of the input/output unit (IO-3) 21*c* where the circuit is configured, and the status of the external connection terminal is fixed. When the circuit configuration of the external connection terminal is executed, data exchange between the PCI bus bridge 174 and the micro controller 171 connected to the external connection terminal is restricted. However, since the status of the external connection terminal does not become undefined due to the circuit configuration but is fixed, the PCI bus bridge 174 and the micro controller 171 connected to the FPGA 20 are not required to be reset at the circuit reconfiguration.

This means that the basic structure described in the "Summary" is preferably applied in such a manner that "the semiconductor device has the external connection terminals and the signal fixation unit also fixes the signals to be output to the external connection terminals." Here, the output part 214 corresponds to an example of the signal fixation unit in this applied embodiment.

(Second Embodiment)

Next, a description is made of a specific second embodiment of the semiconductor device, the information processing circuit board, the information processing apparatus, and the encryption equipment. The FPGA of the second embodiment is different from the FPGA of the first embodiment in that it has program buffers in the input/output units and the logic configuration units. Other than this, the second embodiment is the same as the first embodiment. Accordingly, the same elements as those of the first embodiment are denoted by the same reference symbols, and a description is made of only the difference between the first embodiment and the second embodiment.

Figure 22:
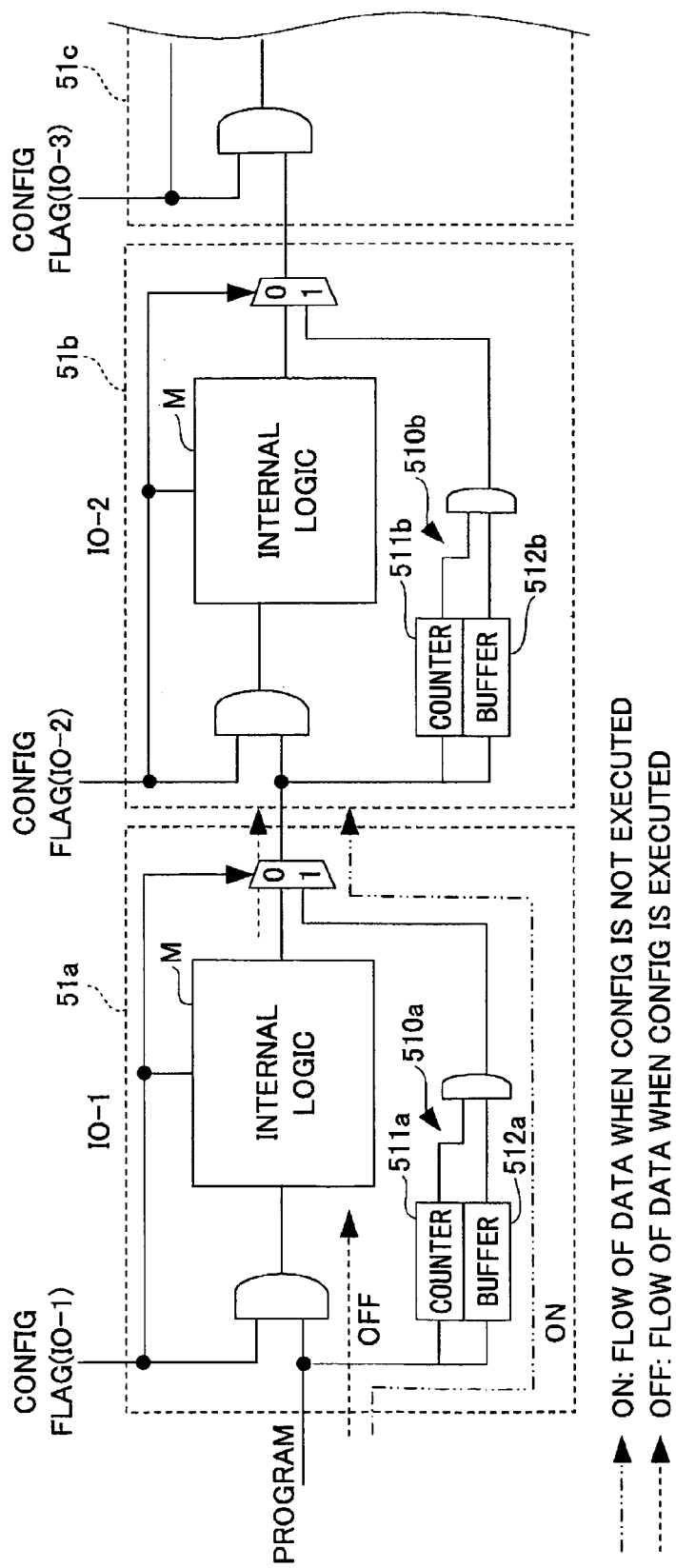
FIG. 22 is a diagram illustrating the input/output units of the FPGA of a second embodiment.

FIG. 22 is a diagram illustrating the input/output units of the FPGA of the second embodiment. In FIG. 22, two input/output units 51*a* and 51*b* are illustrated as the representative examples of the input/output units and the logic configuration units of the FPGA of the second embodiment.

In the input/output unit (IO-1) 51*a* illustrated in FIG. 22, a program buffer 510*a* is provided in a path where the programs are bypassed. The program buffer 510*a* is a circuit that holds the number of the programs to be imported into the internal logic M on the assumption that the execution of the circuit configuration is specified and outputs the programs in the order in which they are held in the program buffer 510*a* when the non-execution of the circuit reconfiguration in the input/output unit (IO-1) 51*a* is specified. The program buffer 510*a* has a counter 511*a* and a buffer 512*a*. The buffer 512*a* holds the programs input to the input/output unit (IO-1) 51*a*. The counter 511*a* counts the number of the programs input to the input/output unit (IO-1) 51*a*. At the point at which the number of the programs counted by the counter 511*a* reaches the number of the programs to be imported into the internal logic M, the programs held in the buffer 512*a* are output to the subsequent input/output unit (IO-2) 51*b*.

Figure 23:
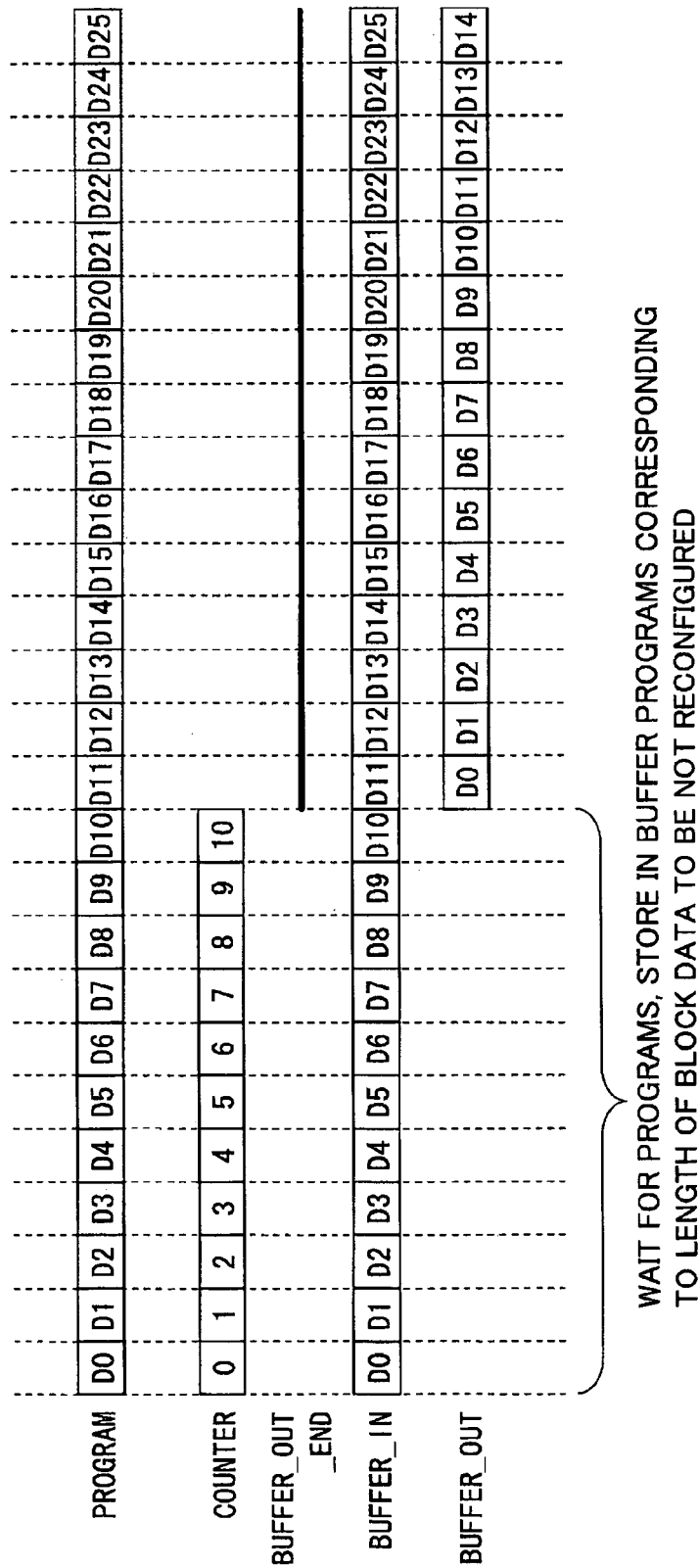
FIG. 23 is a timing chart illustrating the number of the programs counted by a counter illustrated in FIG. 22 and the input/output data of a buffer.

FIG. 23 is a timing chart illustrating the number of the programs counted by the counter 511*a* illustrated in FIG. 22 and the input/output data of the buffer.

Here, a description is made of a case in which the internal logic M of the input/output unit (IO-1) 51*a* (see FIG. 22) imports the programs corresponding to 11 bits.

The programs input to the input/output unit (IO-1) 51*a* are successively input to the buffer 512*a* in the order from D0 (Buffer_in). Further, the number of the programs is counted by the counter 511*a*. When the number of the programs counted by the counter 511*a* reaches 10, the programs held in the buffer 512*a* are successively output in the order from D0 (Buffer_out).

The configuration and the operations of the above program buffer are common to the subsequent input/output unit (IO-2) 51*b* and the remaining input/output units and the logic configuration units not illustrated in FIG. 23. However, the number of the programs held in the buffers 512 and the number of the programs counted by the counters 511 and output from the buffers 512 are made to correspond to the number of the programs to be imported into the internal logics M of the input/output units and the logic configuration units.

In the FPGA of the second embodiment, each of the input/output units and the logic configuration units outputs the programs to the subsequent stage units at the same timing as the execution of the circuit configuration even in a case where the non-execution of the circuit configuration is specified. In the above first embodiment, the programs stored in the config ROM removes their parts corresponding to the input/output units and the logic configuration units where the circuit configuration is not executed as illustrated in, for example, FIG. 21A. On the other hand, in the FPGA of the second embodiment, the programs on the input/output units and/or the logic configuration units (dummy data may be used) where the circuit configuration is not executed can also be stored in the config ROM. Accordingly, the programs are not required to be edited so as to correspond to the execution/non-execution of the circuit configuration when being created.

The means that the basic structure described in the "Summary" is preferably applied in such a manner that "the plural circuit configuration units are connected in series to one another so as to successively hand over the set of the programs, the program supply unit supplies to the plural circuit configuration units the set of the programs corresponding to the plural circuit configuration units and arranged in the order in which they are connected to the plural circuit configuration units, and the plural circuit configuration units have respective program bypassing parts that hold the number of the programs to be imported on the assumption that the execution of the circuit configuration is specified and outputs the programs in the order in which they are held when the non-execution of the circuit reconfiguration is specified by the specification unit." Here, the program buffer 510a corresponds to an example of a program bypassing part in the above applied embodiment.

(Third Embodiment)

Next, a description is made of a specific third embodiment of the semiconductor device, the information processing circuit board, the information processing apparatus, and the encryption equipment. The FPGA of the third embodiment is different from the FPGA of the first embodiment in the control unit. Other than this, the third embodiment is the same as the first embodiment. Accordingly, the same elements as those of the first embodiment are denoted by the same reference symbols, and a description is made of only the difference between the first embodiment and the third embodiment.

Figure 24:
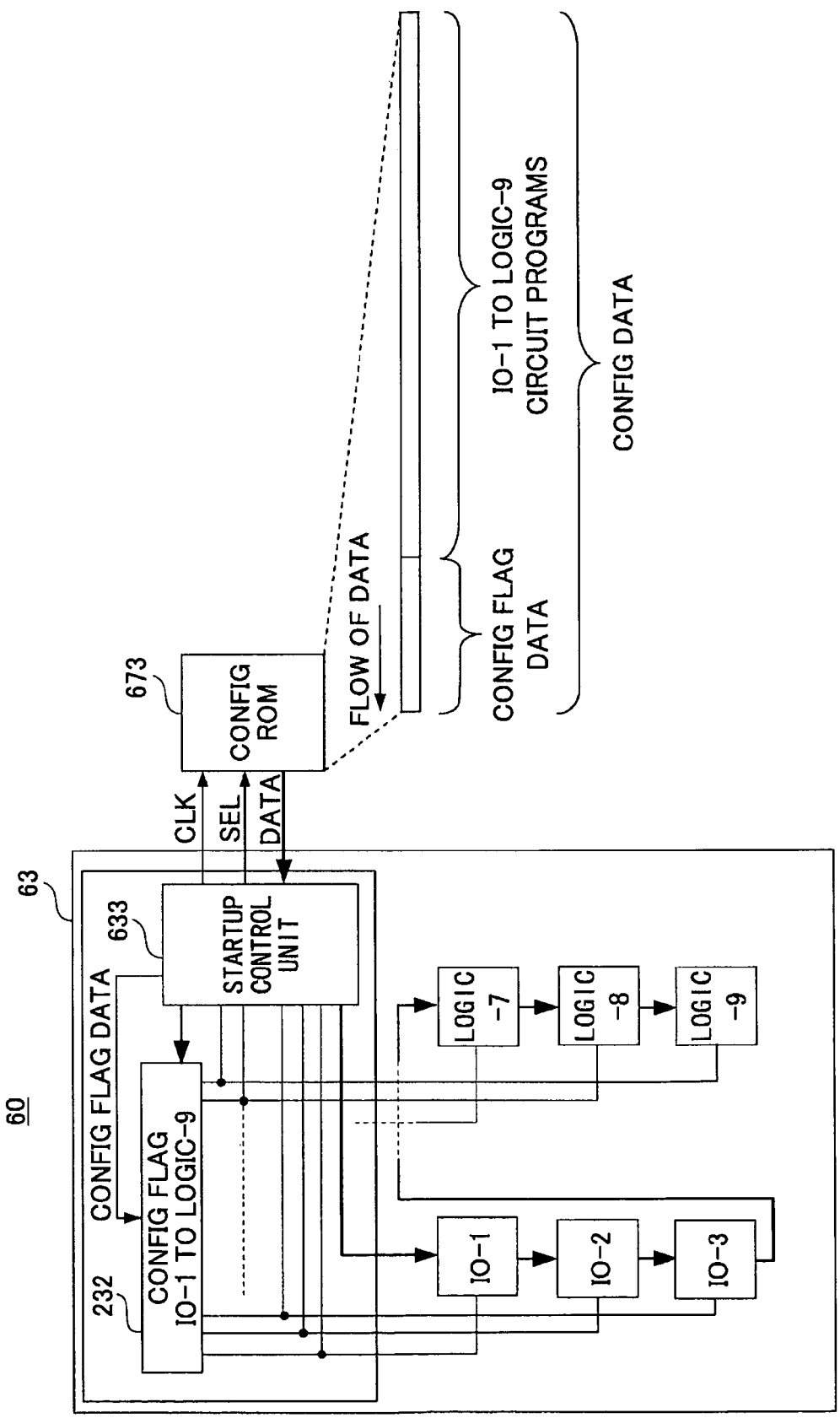
FIG. 24 is a block diagram illustrating the hardware configuration of the FPGA of a third embodiment.

FIG. 24 is a block diagram illustrating the hardware configuration of the FPGA of the third embodiment.

A FPGA 60 illustrated in FIG. 24 is different from the FPGA illustrated in FIG. 14 in that it does not have the I2C interface in the control unit 63. In the FPGA 60 illustrated in FIG. 24, the config flag data are supplied from a config ROM 673 via a startup control unit 633 without passing through the I2C. The config ROM 673 stores the config flag data in addition to the circuit programs of the input/output units and the logic configuration units. Note that the config flag data are stored at the position at which they are read prior to the circuit programs. Further, the startup control unit 633 extracts the config flag data from the data read from the config ROM 673 and transmits them to the config flag register 232. In the FPGA 60 of the third embodiment, the config flag data are not required to be transmitted from the micro controller via the I2C at the circuit configuration. Accordingly, it is possible to simplify the configuration of the encryption card.

(Fourth Embodiment)

Next, a description is made of a specific fourth embodiment of the semiconductor device, the information processing circuit board, and the encryption equipment. The fourth embodiment is different from the first embodiment in that the control unit of the FPGA reads the data from a rewritable storage medium such as a RAM (Random Access Memory) and an EEPROM (Electrical Erasable Read Only Memory) instead of the config ROM and that the encryption card has the rewritable storage medium instead of the config ROM.

Figure 25:
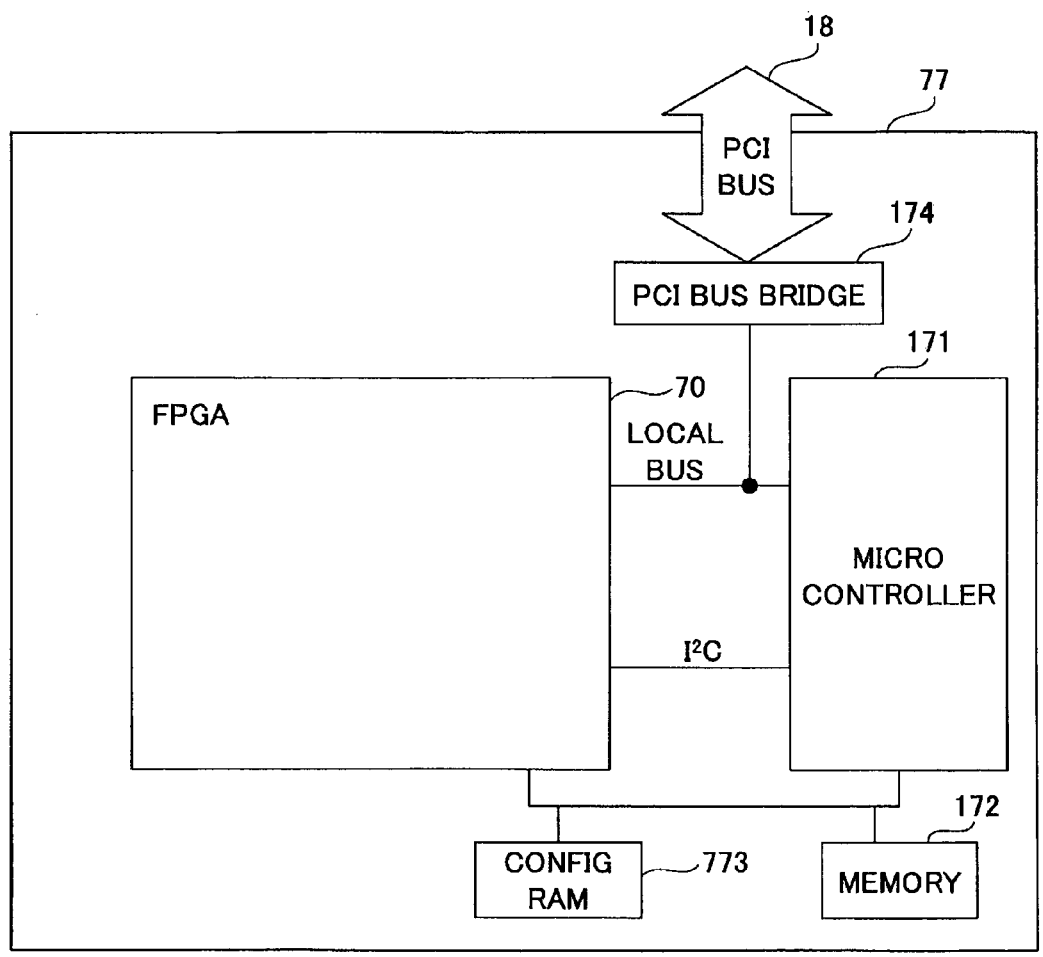
FIG. 25 is a block diagram illustrating the configuration of the encryption card of a fourth embodiment.

FIG. 25 is a block diagram illustrating the configuration of the encryption card of the fourth embodiment.

An encryption card 77 illustrated in FIG. 25 has a config RAM 773, and a FPGA 70 is configured to read the programs from the config RAM 773. Further, the config RAM 773 is also connected to the micro controller 171, and its information may be rewritten by the micro controller 171. In the encryption card illustrated in FIG. 25, the micro controller 171 rewrites the programs of the config RAM 773 into those corresponding to the circuits to be reconfigured and then causes the FPGA 70 to execute the circuit reconfiguration.

According to the encryption card 77 and the FPGA 70 illustrated in FIG. 25, expending of an effort to replace a hardware component such as the config ROM is not required to update the circuits inside the FPGA.

In the respective embodiments described above, the single FPGA is illustrated as the semiconductor device in the basic structure described in the "Summary." However, the semiconductor device may be one in which are combined together a fixed logic circuit part where the reconfiguration cannot be executed and the circuit configuration units where the reconfiguration can be executed.

Figure 26:
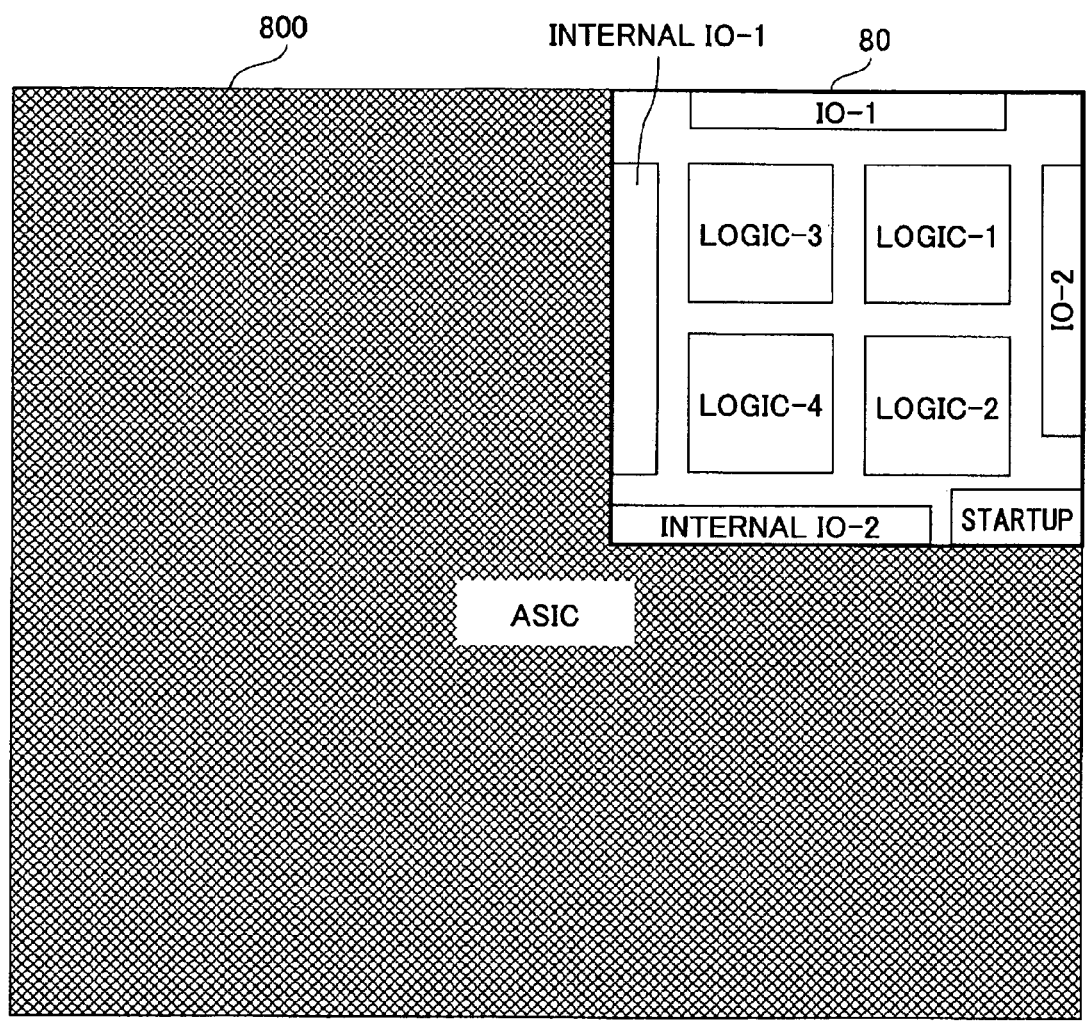
FIG. 26 is a diagram schematically illustrating an example of a semiconductor device in which are combined together a fixed logic circuit part and the circuit configuration units where the circuit reconfiguration can be executed.

FIG. 26 is a diagram schematically illustrating an example of the semiconductor device in which are combined together the fixed logic circuit part and the circuit configuration units where the circuit reconfiguration can be executed.

An IC 800 illustrated in FIG. 26 is an ASIC (Application Specific Integrated Circuit) and includes a FPGA 80 where the circuit reconfiguration can be executed. In the IC 800 illustrated in FIG. 26, even if the circuit reconfiguration is executed in one part of the FPGA 80, the circuits in the other parts can operate.

Further, in the specific respective embodiments described above, the four input/output units 21 and the nine logic configuration units 22 are illustrated as examples of the circuit configuration units in the basic structure described in the "Summary." However, the circuit configuration units are only required to be plural according to the size of the circuits to be configured, and thus any number of the input/output units 21 and logic configuration units 22 may be used.

Further, in the specific respective embodiments, the computer system 100 functioning as a server is illustrated as an example of an information processing apparatus in the above basic structure. However, the information processing apparatus may function as a client or operate on a standalone basis. Further, in the specific respective embodiments, the encryption processing apparatus having the database, the encryption circuit, and the communication unit is illustrated as an example of the information processing apparatus in the above basic structure. However, the information processing equipment is only required to use a hardware circuit to execute processing with respect to the information input from the outside.

Further, in the specific respective embodiments, the input/output circuit 32 is illustrated as an example of an input/ output circuit configured in the semiconductor device in the above basic structure. However, the input/output circuit in the basic structure is only required to input/output processing data to a first information processing circuit configured in the semiconductor device and may execute processing other than the processing of inputting and outputting the processing data. For example, the input/output circuit may execute the calculation processing of the data.

Further, in the specific respective embodiments, the DES encryption circuit and the AES encryption circuit are illustrated as examples of a first information encryption circuit and a second information encryption circuit, respectively, in the above basic structure. However, these encryption circuits may be based on a triple DES, an RSA, or other encryption systems other than the DES or the AES. Further, in the specific respective embodiments, the circuit for the encryption processing is illustrated. However, the information encryption circuit in the basic structure may be a circuit that executes decryption processing with respect to encrypted data.

Further, in the specific respective embodiments, the encryption circuits are illustrated as examples of a first information processing circuit and a second information processing circuit in the above basic structure. However, these information processing circuits may be, for example, mathematical operation circuits other than the encryption circuits.

All examples and conditional language recited herein are intended for pedagogical purposes to aid the reader in understanding the present invention and the concepts contributed by the inventor to furthering the art, and are to be construed as being without limitation to such specifically recited examples and conditions, and the organization of such examples in the specification does not relate to a showing of the superiority or inferiority of the present invention. Although the embodiment of the present invention has been described in detail, it should be understood that the various changes, substitutions, and alterations could be made hereto without departing from the spirit and scope of the present invention.

What is claimed is:

1. A semiconductor device comprising:
    a circuit information supply unit that supplies circuit information acquired from an outside of the semiconductor device;
    a plurality of circuit configuration units that configure a plurality of circuits, respectively, based on the circuit information supplied from the circuit information supply unit;
    a specification unit that specifies whether to execute a circuit configuration with respect to the plurality of circuit configuration units, wherein at least one first circuit configuration unit is specified to execute the circuit configuration and at least one second circuit configuration unit is specified not to execute the circuit configuration; and
    a signal fixation unit that fixes a value of a signal outputted from the at least one first circuit configuration unit to a designated value, and not a value of a signal outputted from the at least one second circuit configuration unit, during a time in which the at least one first circuit configuration unit configures a corresponding one of the plurality of circuits based on the circuit information.

2. The semiconductor device according to claim 1, further comprising:
    a plurality of external connection terminals,
    wherein the signal fixation unit fixes the value of the signal outputted from the at least one first circuit configuration unit via a corresponding one of the plurality of external connection terminals to the designated value during the time in which the at least one first circuit configuration unit configures the corresponding one of the plurality of circuits based on the circuit information.

3. The semiconductor device according to claim 1, wherein
    the plurality of circuit configuration units are coupled in series to one another so as to successively transfer the circuit information therebetween,
    the circuit information supply unit supplies a plurality of circuit information to the plurality of circuit configuration units, respectively, and
    the at least one second circuit configuration unit includes a bypassing portion that holds and outputs circuit information of one of the plurality of circuits corresponding to the at least one second circuit configuration unit.

4. The semiconductor device according to claim 1, wherein the at least one second circuit configuration unit continues to operate during the time in which the at least one first circuit configuration unit configures the corresponding one of the plurality of circuits based on the circuit information.

5. An information processing apparatus comprising:
    a storage unit; and
    a semiconductor circuit device coupled to the storage unit,
    wherein the storage unit stores circuit information of the semiconductor circuit device, and
    the semiconductor circuit device includes
        a circuit information supply unit that supplies the circuit information acquired from the storage unit;
        a plurality of circuit configuration units that configure a plurality of circuits, respectively, based on the circuit information supplied from the circuit information supply unit;
        a specification unit that specifies whether to execute a circuit configuration with respect to the plurality of circuit configuration units, wherein at least one first circuit configuration unit is specified to execute the circuit configuration and at least one second circuit configuration unit is specified not to execute the circuit configuration; and
        a signal fixation unit that fixes a value of a signal outputted from the at least one first circuit configuration unit to a designated value, and not a value of a signal outputted from the at least one second circuit configuration unit, during a time in which the at least one first configuration unit configures a corresponding one of the plurality of circuits based on the circuit information.

6. The information processing apparatus according to claim 5, wherein
    the semiconductor circuit device further includes a plurality of external connection terminals, and
    the signal fixation unit fixes the value of the signal outputted from the at least one first circuit configuration unit via a corresponding one of the plurality of external connection terminals to the designated value during the time in which the at least one first circuit configuration unit configures the corresponding one of the plurality of circuits based on the circuit information.

7. The information processing apparatus according to claim 5, wherein
    the plurality of circuit configuration units are coupled in series to one another so as to successively transfer the circuit information therebetween,
    the circuit information supply unit supplies a plurality of circuit information to the plurality of circuit configuration units, respectively, and the at least one second circuit configuration unit includes a bypassing portion that holds and outputs circuit information of one of the plurality of circuits corresponding to the at least one second circuit configuration unit.

8. The information processing apparatus according to claim 5, wherein the plurality of circuit configuration units configure a plurality of encryption circuits that encrypt data, respectively.

9. The information processing apparatus according to claim 5, wherein the plurality of circuit configuration units configure a plurality of decryption circuits that decrypt encrypted data, respectively.

10. The information processing apparatus according to claim 5, wherein the at least one second circuit configuration unit continues to operate during the time in which the at least one first circuit configuration unit configures the corresponding one of the plurality of circuits based on the circuit information.

11. A method for configuring circuits of a semiconductor device, the method comprising:
   supplying circuit information acquired from an outside of the semiconductor device from a circuit information supply unit within the semiconductor device;
   configuring a plurality of circuits by a plurality of circuit configuration units within the semiconductor device, respectively, based on the circuit information supplied from the circuit information supply unit;
   specifying whether to execute a circuit configuration with respect to the plurality of circuit configuration units by a specification unit within the semiconductor device, wherein at least one first circuit configuration unit is specified to execute the circuit configuration and at least one second circuit configuration unit is specified not to execute the circuit configuration; and
   fixing a value of a signal outputted from the at least one first circuit configuration unit to a designated value by a signal fixation unit within the semiconductor device, and not a value of a signal outputted from the at least one second circuit configuration unit, during a time in which the at least one first circuit configuration unit configures a corresponding one of the plurality of circuits based on the circuit information.

12. The method for configuring the circuits of the semiconductor device according to claim 11, wherein
   the fixing fixes the value of the signal outputted from the at least one first circuit configuration unit via a corresponding one of a plurality of external connection terminals within the semiconductor device to the designated value during the time in which the at least one first circuit configuration unit configures the corresponding one of the plurality of circuits based on the circuit information.

13. The method for configuring the circuits of the semiconductor device according to claim 11, further comprising:
   successively transferring the circuit information between the plurality of circuit configuration units that are coupled in series to one another;
   supplying, by the supplying, a plurality of circuit information to the plurality of circuit configuration units, respectively; and
   holding and outputting circuit information of one of the plurality of circuits corresponding to the at least one second circuit configuration unit, by a bypassing portion of the at least one second circuit configuration unit.

14. The method for configuring the circuits of the semiconductor device according to claim 11, wherein the at least one second circuit configuration unit continues to operate during the time in which the at least one first circuit configuration unit configures the corresponding one of the plurality of circuits based on the circuit information.

* * * * *